(12) United States Patent
Furuta et al.

(10) Patent No.: US 12,471,447 B2
(45) Date of Patent: Nov. 11, 2025

(54) ORGANIC DEVICE, DISPLAY APPARATUS, AND ELECTRONIC APPARATUS

(71) Applicant: CANON KABUSHIKI KAISHA, Tokyo (JP)

(72) Inventors: Tomonari Furuta, Kanagawa (JP); Masumi Itabashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 700 days.

(21) Appl. No.: 17/858,876

(22) Filed: Jul. 6, 2022

(65) Prior Publication Data
US 2023/0016797 A1 Jan. 19, 2023

(30) Foreign Application Priority Data
Jul. 7, 2021 (JP) .................................. 2021-112965

(51) Int. Cl.
| | |
|---|---|
| *H10K 59/122* | (2023.01) |
| *H10K 59/12* | (2023.01) |
| *H10K 59/38* | (2023.01) |
| *H10K 102/00* | (2023.01) |

(52) U.S. Cl.
CPC ....... *H10K 59/122* (2023.02); *H10K 59/1201* (2023.02); *H10K 59/38* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 11,930,657 B2 * | 3/2024 | Jo .................. | H10K 59/124 |
| 2011/0121346 A1 * | 5/2011 | Yamada ............ | H05B 33/24 |
| | | | 257/98 |

(Continued)

FOREIGN PATENT DOCUMENTS

| | | |
|---|---|---|
| JP | 2011021223 A | 2/2011 |
| JP | 2014065973 A | 4/2014 |
| JP | 2014232631 A | 12/2014 |

*Primary Examiner* — Michelle Mandala
(74) *Attorney, Agent, or Firm* — Canon U.S.A., Inc. IP Division

(57) ABSTRACT

An organic device includes a first element and a second element disposed adjacent to the first element. The first and second elements include a first electrode, a second electrode, an organic layer disposed between the first and second electrodes, and an insulation layer covering the first electrode. The insulation layer has an eaves shape including a protruding portion protruding from the insulation layer of the first element toward the second element. The organic layer includes a charge transport layer and a functional layer and satisfies the following:

$$\begin{cases} 2t > x2 > 2t' \\ t > x1 > t' \\ y > t' \end{cases} \quad (1)$$

where t represents a total film thickness of the organic layer in the eaves shape, t' represents a film thickness of the charge transport layer, x1 represents a protruding amount, x2 represents a distance between the eaves shapes of the first and second elements, and y represents a distance from a lower surface of the first electrode to the protruding portion.

14 Claims, 17 Drawing Sheets

(56) References Cited

U.S. PATENT DOCUMENTS

| | | | |
|---|---|---|---|
| 2015/0048328 A1* | 2/2015 | Kato | H10K 59/80515 |
| | | | 438/34 |
| 2021/0313407 A1* | 10/2021 | Li | H10K 59/124 |
| 2022/0019035 A1* | 1/2022 | Li | G02B 6/4214 |

* cited by examiner

ORGANIC DEVICE, DISPLAY APPARATUS, AND ELECTRONIC APPARATUS

BACKGROUND OF THE INVENTION

Field of the Invention

The present disclosure relates to an organic device with a reduced leakage current between pixels, and a display apparatus and an electronic apparatus including the organic device.

Description of the Related Art

A variety of organic devices using functional organic compounds have recently been developed. An organic light-emitting device is an example of organic devices including a plurality of light-emitting devices. An organic electroluminescence (EL) element, which is an example of light-emitting elements, is an element including an upper electrode, a lower electrode, and an organic layer disposed between the upper electrode and the lower electrode. Such an organic EL element is light in weight and thin in thickness and has less restriction on its shape. For this reason, a light-emitting device and a display apparatus including such an organic EL element have attracted attention. To enhance the image quality of a display apparatus, increasing the number of pixels is known to be effective at providing a higher definition display.

However, reducing the distance between organic EL elements to achieve a higher definition display causes an unintended light emission due to a current flowing between an organic EL element and another organic EL element adjacent to the organic EL element. This unintended current is called a leakage current between pixels. Such an unintended light emission due to a leakage current between pixels degrades the image quality of a display apparatus. Particularly, in a case where the organic layer is disposed continuously over a plurality of organic EL elements, the leakage current has a significant influence on the organic EL elements. Thus, a configuration for reducing a leakage current between pixels in organic EL elements has been actively studied.

Japanese Patent Application Laid-Open No. 2014-232631 discusses a light-emitting device that includes a lower electrode and a partition edge portion covering an end of the lower electrode and has an eaves shape at the partition edge portion. In the light-emitting device, a leak current between pixels is reduced by the eaves shape at the partition edge portion, which contributes to disconnecting an organic layer or increasing the resistance of the organic layer.

Japanese Patent Application Laid-Open No. 2014-232631 discusses a technique for disconnecting the organic layer or increasing the resistance of the organic layer using the eaves shape at the partition edge portion. However, since the effectiveness of this technique depends on the thickness of the organic layer and the height of the partition, display quality can be degraded.

SUMMARY OF THE INVENTION

The present disclosure is directed to providing an organic device with a reduced leakage current between pixels.

According to an aspect of the present disclosure, an organic device includes a first element, and a second element disposed adjacent to the first element in a first direction, wherein the first element and the second element include a first electrode, a second electrode, an organic layer disposed between the first electrode and the second electrode, and an insulation layer covering an upper surface and a side surface of the first electrode at an end of the first electrode, wherein the first electrode, the organic layer, and the second electrode are disposed in this order in a second direction vertical to the first direction, wherein the insulation layer has, between the first element and the second element, an eaves shape including a protruding portion protruding from the insulation layer of the first element toward the second element, and wherein the organic layer includes a charge transport layer and a functional layer and satisfies the following Inequality (1):

$$\begin{cases} 2t > x2 > 2t' \\ t > x1 > t' \\ y > t' \end{cases} \quad (1)$$

where t represents a total film thickness in the second direction of the organic layer including the charge transport layer and the functional layer in the eaves shape, t' represents a film thickness in the second direction of the charge transport layer in the eaves shape, x1 represents a protruding amount of the eaves shape in the second direction, x2 represents a distance between the eaves shape of the first element and the eaves shape of the second element, and y represents a distance in the first direction from a lower surface of the first electrode to the protruding portion of the eaves shape.

Further features of the present disclosure will become apparent from the following description of exemplary embodiments with reference to the attached drawings.

BRIEF DESCRIPTION OF THE DRAWINGS

FIGS. 6A to 6I are diagrams illustrating an example of a schematic flow of manufacturing the organic device according to the first exemplary embodiment.

DESCRIPTION OF THE EMBODIMENTS

Figure 1A:
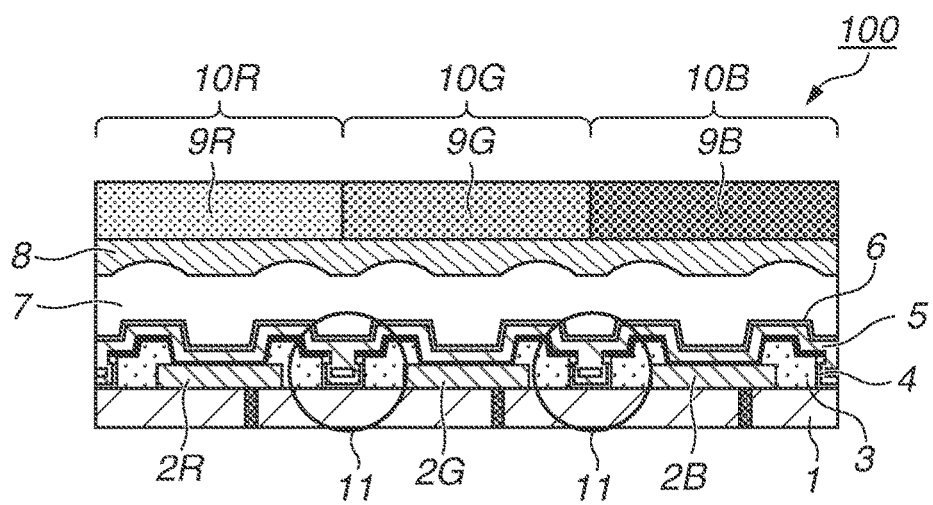
FIG. 1A is a sectional view schematically illustrating a configuration of an organic device according to a first exemplary embodiment of the present disclosure.

A light-emitting device according to an exemplary embodiment of the present disclosure will be described in detail below with reference to the accompanying drawings. In the following description and the drawings, components that are common throughout the drawings are denoted by the same reference numerals. The common components will be described with cross reference to a plurality of drawings, and a description of the components denoted by the same reference numerals will be omitted as appropriate.

In the present exemplary embodiment, the terms "upper" and "lower" indicate the vertical direction in the drawings. The term "height" refers to the distance from an upper surface of a substrate in the upward direction. The "height" may be designated based on a flat portion that is parallel to the upper surface of the substrate.

FIGS. 1A to 1D are schematic sectional views each illustrating a light-emitting device 100 according to a first exemplary embodiment of the present disclosure. FIG. 1A is a sectional view of the light-emitting device 100 taken along a section vertical to a principal surface of a substrate. The light-emitting device 100 includes light-emitting elements 10R, 10G, and 10B that emit different colors of light, respectively. Also, in the other components, the reference symbol denoting a blur light-emitting element may include B. If there is no need to identify the respective colors of emitted light, reference symbols "R", "G", and "B" are not added. For example, the light-emitting element 10B represents the blue light-emitting element, and the light-emitting element 10 represents any one of the light-emitting elements 10R, 10G, and 10B.

The light-emitting element 10 includes an interlayer insulation layer 1, a lower electrode 2 disposed on the interlayer insulation layer 1, a partition 3, an organic layer 4 including a charge transport layer, an organic layer 5 including a functional layer, an upper electrode 6, a protective layer 7, a resin layer 8, a color filter 9, and an eaves portion 11 of the partition 3. A top-emission light-emitting device is described as an example of the light-emitting device 100. However, the type of the light-emitting device 100 is not limited to a top-emission light-emitting device. In a case where the functional layer functions as a light-emitting layer, an organic light-emitting device is used as an organic device, and in a case where the functional layer functions as an organic photoelectric conversion layer, an organic photoelectric conversion device is used as the organic device.

Figure 1B:
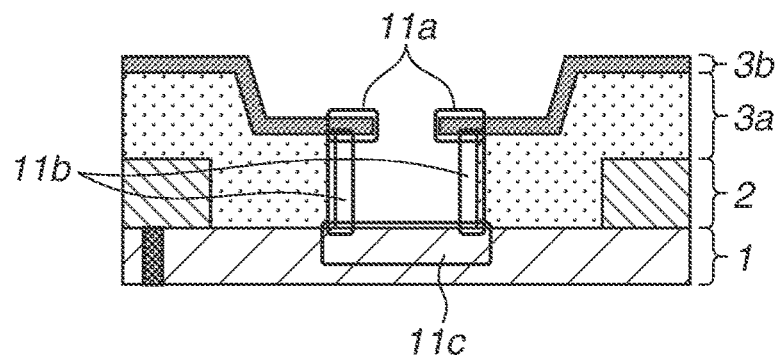
FIG. 1B is a sectional view schematically illustrating an eaves shape of a partition between light-emitting elements.

FIG. 1B is a schematic view illustrating an eaves portion of the partition between the light-emitting elements 10. Upper portions 11a and side surface portions 11b of the eaves portion are formed of the partition 3. A bottom portion 11c of the eaves portion is formed of the interlayer insulation layer 1. The partition 3 includes a partition portion 3a and a partition upper portion 3b. The partition portion 3a and the partition upper portion 3b may be made of materials different from each other.

Figure 1C:
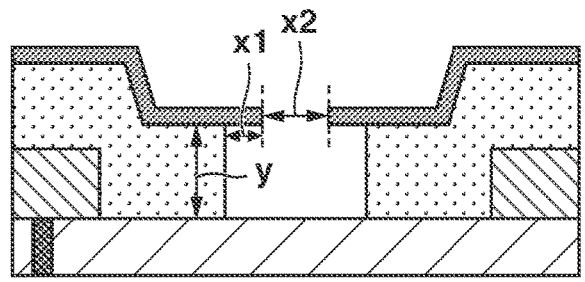
FIG. 1C is a sectional view illustrating parameters of the shape of the eaves portion.

FIG. 1C illustrates parameters representing an eaves shape of the eaves portion 11. A protruding amount of the upper portion 11a of the eaves portion from corresponding one of the side surface portion 11b of the eaves portion is represented by x1, and a distance between leading edges of the upper portions 11a of the eaves portion in the horizontal direction is represented by x2. As illustrated in FIGS. 1B and 1C, the eaves shape is formed on both sides. In a case where the eaves shape is formed only on one side, the distance x2 corresponds to the distance from the upper portion 11a to a wall surface in the horizontal direction. The height of each of the upper portions 11a of the eaves portion from the bottom portion 11c of the eaves portion in the vertical direction is represented by y.

Figure 1D:
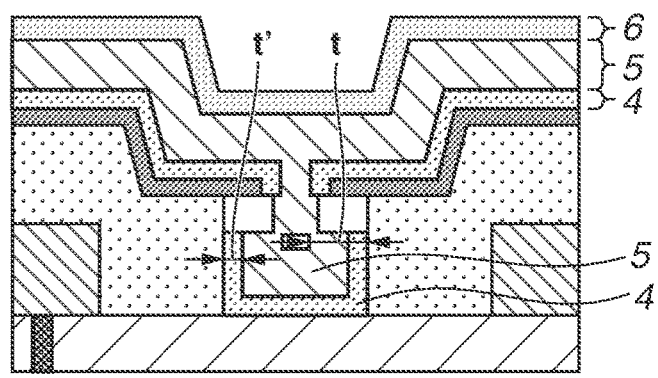
FIG. 1D is a sectional view schematically illustrating a relationship among the shape of the eaves portion illustrated in FIG. 1C, a film thickness of an organic layer including a charge transport layer, and a total film thickness of the charge transport layer and a light-emitting layer, which are for reducing a leakage current between pixels in a light-emitting device according to an exemplary embodiment of the present disclosure.

FIG. 1D illustrates a relationship among the shape of the eaves portion illustrated in FIG. 1C, a film thickness t' of the organic layer 4 including the charge transport layer, and a total film thickness t of the charge transport layer and the light-emitting layer, which is for reduction in a leakage current between pixels in the light-emitting device 100 according to the first exemplary embodiment. Specifically, FIG. 1D illustrates a state where an organic film is deposited in the eaves portion. The organic layer 4 including the charge transport layer is formed on the interlayer insulation layer 1, the lower electrode 2, and the partition 3. In the eaves portion, a part of the organic layer 4 is formed in a discontinuous manner, or the thickness of the organic layer 4 is reduced. The formation of this portion makes it possible to reduce crosstalk between the light-emitting elements 10.

In the light-emitting device 100 according to the present exemplary embodiment, the protruding amount x1 of the eaves portion is smaller than the total film thickness t of the organic layer 5 including a charge transport region and the functional layer (light-emitting layer), and is larger than the film thickness t' of the organic layer 4 including the charge transport layer. The distance x2 between the leading edges of the eaves portions is smaller than twice the total film thickness t and is larger than twice the film thickness t'. The height y of the eaves portion is greater than the film thickness That is, the following three inequalities included in Inequality (1) are satisfied. In other words, the height y corresponds to the distance from the eaves shape to a lower surface of a first electrode in a second direction.

$$\begin{cases} 2t > x2 > 2t' \\ t > x1 > t' \\ y > t' \end{cases} \quad (1)$$

When the relationship represented by Inequality (1) is satisfied, the light-emitting device 100 becomes a device having a reduced leakage current between pixels.

When a film is formed with a desired film thickness on the eaves shape, the organic layer 4 including the charge transport layer is formed not continuously. The upper surface of the organic layer 5 including the light-emitting layer is continuously formed at a height higher than the eaves portion. Accordingly, the upper electrode 6 is formed continuously on the organic layer 5.

Process variations may occur in the process of forming the eaves shape and the process of forming the organic layer 4 including the charge transport layer and the organic layer 5 including the light-emitting layer. In this case, the eaves portion 11 may be designed in such a manner that, in a section, a maximum value of the film thickness t' of the organic layer 4 including the charge transport layer, a minimum value of the total film thickness t of the organic layer 5 including the charge transport region and the light-emitting layer, and a minimum value of the height y of the eaves portion 11 satisfy Inequality (1). In other words, the organic device may satisfy Inequality (1) when the total film thickness t is a minimum film thickness and the film thickness t' is a maximum film thickness in a section.

While, the organic layer 4 has a discontinuous portion at least in the eaves shape, a second electrode is continuously formed between a first element and a second element.

When the width of an opening region above the lower electrode 2 satisfies the distance x2 between the leading edges of the eaves portion 11, the eaves shape may be formed in the opening region above the lower electrode 2 with a size larger than the total film thickness t of the organic layer 4 including the charge transport layer and the organic layer 5 including the light-emitting layer. In addition, the area of the opening region above the lower electrode 2 is defined in many cases to obtain desired characteristics of the opening region above the lower electrode 2 in the light-emitting device 100. Accordingly, the eaves shape may be disposed in a region different from the opening region above the lower electrode 2.

In the light-emitting device 100 according to the present exemplary embodiment, at least some of the side surface portions 11b of the eaves portion 11, which is a part of the partition 3, the upper portions 11a of the eaves portion 11, and the bottom portion 11c formed of the interlayer insulation layer 1 may be formed of different types of insulation films. For example, the upper portions 11a of the eaves portion 11 may be made of an organic material, the side surface portions 11b of the eaves portion 11 may be made of an inorganic material, and the bottom portion 11c of the eaves portion 11 may be made of an inorganic material. In this case, the side surface portions 11b and the bottom portion 11c of the eaves portion 11 may be made of the same or different types of inorganic materials.

To increase the total film thickness t of the organic layer 4 including the charge transport layer and the organic layer 5 including the light-emitting layer, the upper portions 11a of the eaves portion 11 as a part of the partition 3 and the bottom portion 11c of the eaves portion 11 formed of the interlayer insulation layer 1 may be formed of different types of insulation films, respectively, to increase the height y of the eaves portion 11. In this case, the upper portions 11a, the side surface portions 11b, and the bottom portion 11c of the eaves portion 11 are formed of insulation films of types different from each other. It may be desirable to select different types of materials for at least some of the upper portions 11a, the side surface portions 11b, and the bottom portion 11c of the eaves portion 11, to facilitate formation of the eaves shape.

Specifically, according to the first exemplary embodiment, an organic device including a first element and a second light-emitting element disposed adjacent to the first element in a first direction of the first element can be manufactured by an organic device manufacturing method including a process of manufacturing the first element and the second element. The process of manufacturing the first element and the second element includes a process of forming the first electrode, a process of forming an insulation layer covering an end of the first electrode, a process of forming an organic layer on the first electrode and the insulation layer, and a process of forming a second electrode on the organic layer. The process of forming the insulation layer includes a process of forming a first insulation layer on the first electrode, a process of forming a second insulation layer on the first insulation layer, and an etching process of etching the first insulation layer and the second insulation layer. In the etching process, an etching rate of the first insulation layer is different from an etching rate of the second insulation layer.

In the manufacturing method according to the present exemplary embodiment, the etching rate of the first insulation layer may be larger than the etching rate of the second insulation layer. The etching rates may be compared at 25°

C. As long as the etching rate condition is satisfied, either one of a wet etching process and a dry etching process may be used.

In the etching process on the insulation layer, an eaves shape including a protruding portion protruding from the insulation layer of the first element toward the second element is formed between the first element and the second element. Accordingly, the etching process may include a first etching process and a second etching process. In the second etching process, the etching rate of the first insulation layer may be smaller than the etching rate of the second insulation layer.

Figure 2A:
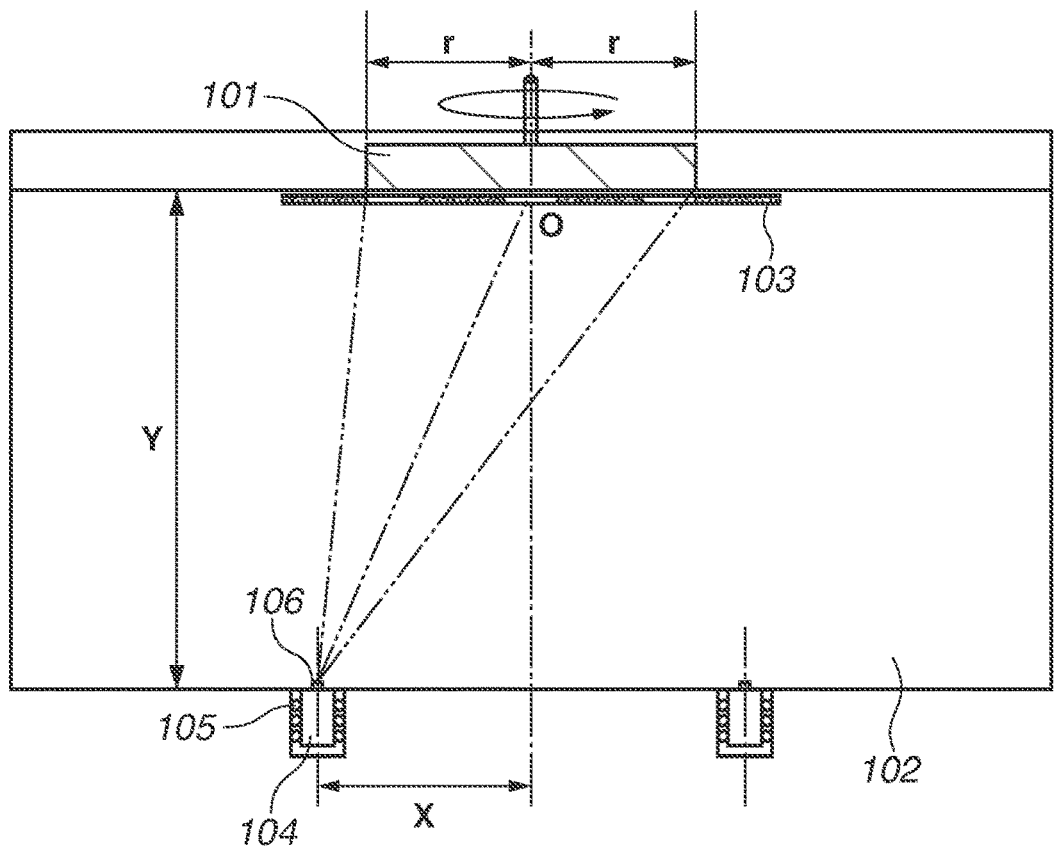
FIG. 2A is a diagram illustrating an example of a point-source vapor deposition apparatus.
Figure 2B:
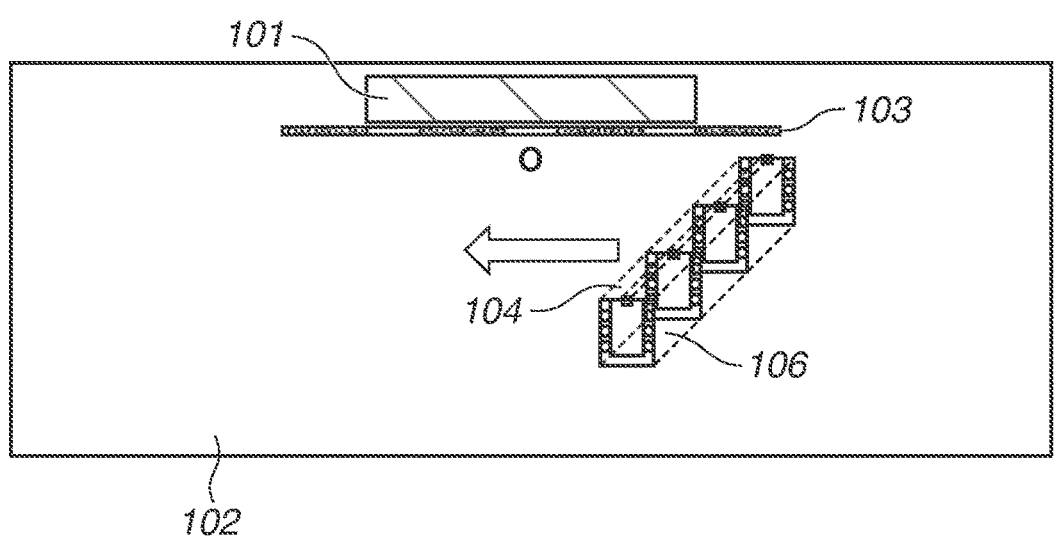
FIG. 2B is a diagram illustrating an example of a line-source vapor deposition apparatus.

FIGS. 2A and 2B are schematic views each illustrating a vapor deposition apparatus. FIG. 2A illustrates an example of a point-source vapor deposition apparatus, and FIG. 2B illustrates an example of a line-source vapor deposition apparatus. While the present exemplary embodiment illustrates an example where the point-source vapor deposition apparatus illustrated in FIG. 2A is used, the configuration of the vapor deposition apparatus is not particularly limited, as long as the advantageous effect of reducing crosstalk between the light-emitting elements 10 using the eaves shape according to the present exemplary embodiment can be obtained.

The vapor deposition apparatus illustrated in FIG. 2A is provided with a vacuum chamber 102. A plurality of crucibles 104 is disposed in the vacuum chamber 102. A heater 105 corresponding to each crucible 104 is heated to increase the temperature in the crucible 104 and to sublimate the material in the crucible 104. The sublimated material is diffused in the vacuum chamber from a nozzle 106 and is deposited on a substrate 101. When a metal mask 103 is used, the material is deposited mainly on an opening portion of the metal mask 103.

When a plurality of light-emitting devices is on the substrate 101, it may be desirable to selectively deposit the material on the portion where the plurality light-emitting devices is present. In this case, the metal mask 103 having openings on the portions each corresponding to different one of the plurality of the light-emitting devices on the substrate 101 can be used. The substrate 101 may be configured to rotate about "O". The rotation of the substrate 101 increases the evenness of adhesion of a vapor deposition material.

FIG. 2B illustrates a vapor deposition apparatus having a configuration called a line source in which a plurality of vapor deposition sources is disposed and arranged along a line. This line source may be configured to move relative to the substrate 101. More specifically, the substrate 101 may be configured to move relative to the line source, or the line source may be configured to move relative to the substrate 101. FIG. 2B illustrates a configuration in which the line source moves in a direction indicated by an arrow.

Figure 3A:
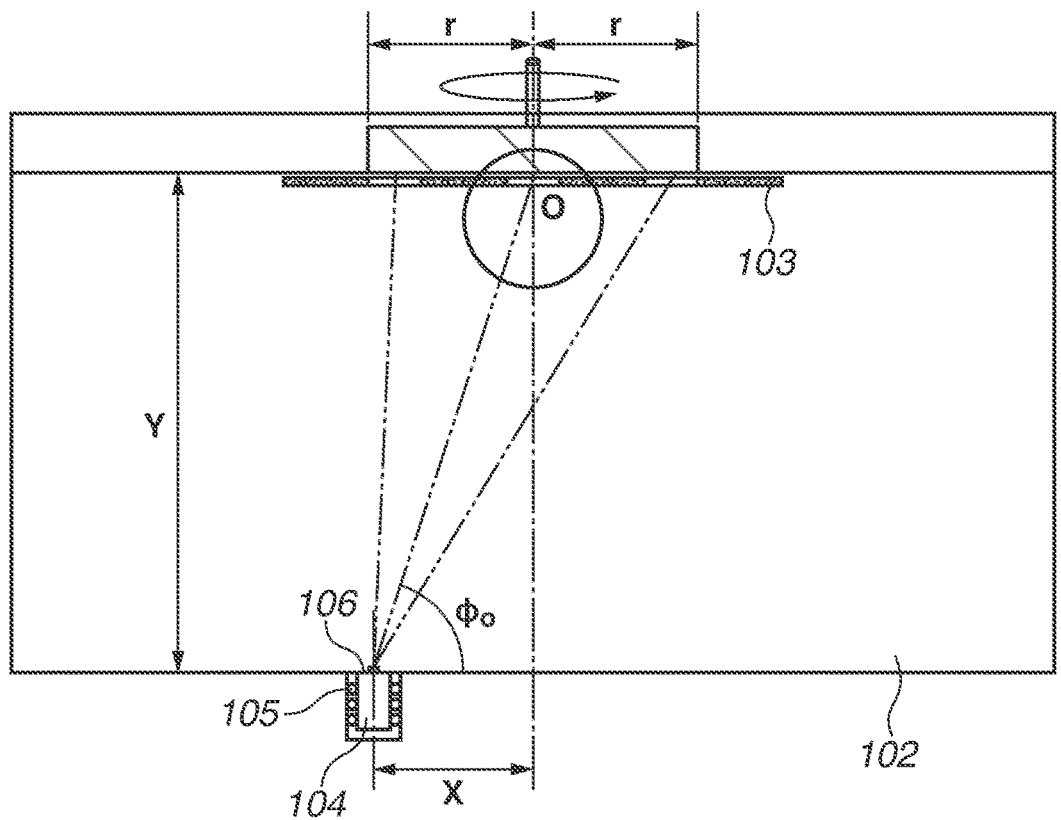
FIG. 3A is a diagram illustrating a relationship between a crucible and the eaves shape.

FIG. 3A illustrates a relationship between the crucible 104 and the eaves portion 11. In the case of using the point-source vapor deposition apparatus, the crucible 104 is set at a fixed point. According, for example, when the crucible 104 is set at a position that is away from the center "O" of the substrate 101 by "X" in the lateral direction and by "Y" in the longitudinal direction, vapor deposition particles diffused mainly from the nozzle 106 at an angle of arctan (Y/X) are deposited on the substrate 101. Also, in the case of using the line-source vapor deposition apparatus, while the crucible 104 moves relative to the substrate 101, vapor deposition particles diffused from the nozzle 106 are diffused with a certain spread, and thus the vapor deposition particles are obliquely deposited on the substrate 101.

If the partition 3 includes no recessed portion, such as the eaves shape, the upper portion of the partition 3 is continuously formed and thus deposition particles are deposited in a continuous film.

Figure 3B:
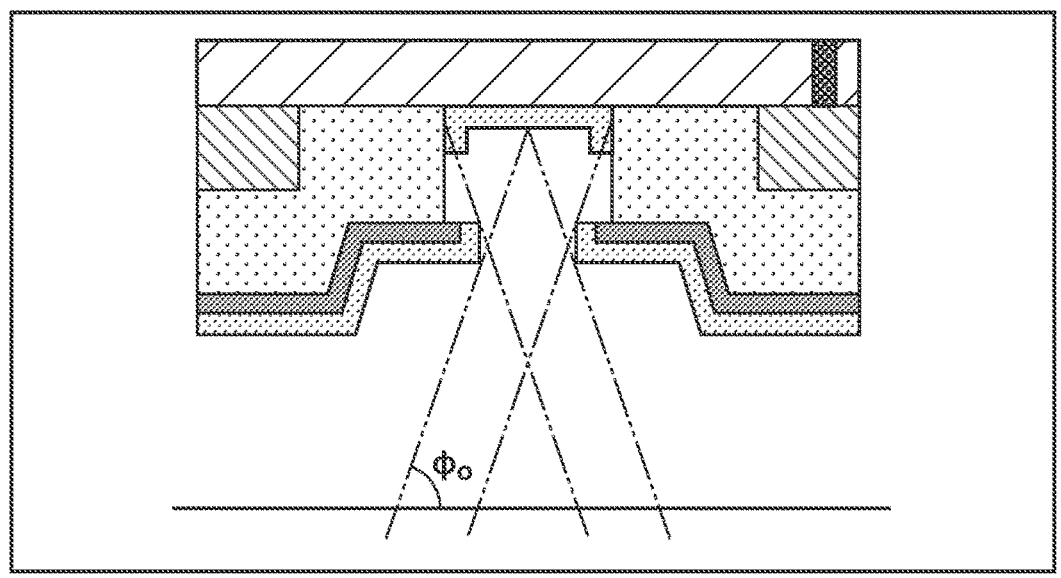
FIG. 3B is an enlarged view illustrating a portion indicated by "O" in FIG. 3A.

FIG. 3B is an enlarged view of the portion indicated by "O" in FIG. 3A. In this portion, since there are regions shielded from vapor deposition particles due to the eaves shape, vapor deposition particles are discontinuously deposited on the side surface portion and the like of the eaves shape. Since electric charges are not transported in the discontinuous portion, the advantageous effect of reducing crosstalk between the light-emitting elements 10 can be obtained. To obtain the effect, it may be desirable to satisfy the following conditions 1 to 5.

[Condition 1]

If the thickness of the film deposited on at least the side surface of the eaves portion 11 is greater than the protruding amount x1 of the eaves portion 11, there arises a possibility that the film deposited in the lateral direction at the leading edges of the upper portions 11a of the eaves portion 11 and the film deposited on the side surface portions 11b of the eaves portion 11 are continuously formed. To ensure the discontinuity of the organic layer 4 including the charge transport layer, the protruding amount x1 of the eaves portion 11 is set to be greater than the film thickness t' of the film deposited on the side surface portions 11b of the eaves portion 11. This condition is set as [Condition 1].

[Condition 2]

If the layers up to the upper electrode 6 are deposited using a vapor deposition method while Condition 1 is satisfied, the upper electrode 6 can also be formed as a discontinuous film, which may cause a light-emitting failure. To reduce the possibility of formation of a discontinuous film in the upper electrode 6, the following condition is satisfied.

When the distance x2 between the leading edges of the eaves portion 11 is designed to be smaller than twice the total film thickness t of the organic layer 4 including the charge transport layer and the organic layer 5 including the light-emitting layer to be deposited on the side surface portions 11b of the eaves portion 11, the organic film is formed continuous between the leading edges of the eaves portion 11 during deposition of the organic layer 5 including the light-emitting layer.

FIGS. 4A to 4D are diagrams illustrating deposition processes on the eaves portion 11.

Figure 4A:
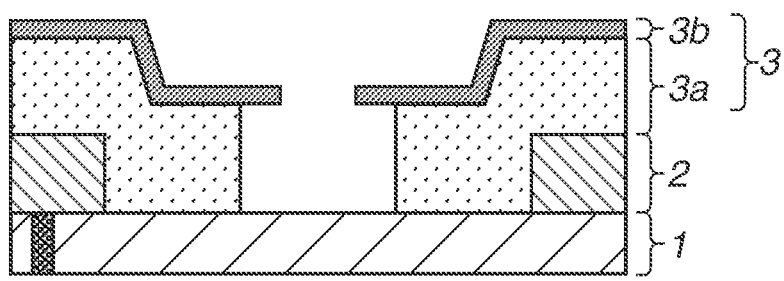
FIG. 4A is a diagram illustrating a state where formation of the eaves shape is completed.

FIG. 4A illustrates a state where formation of an eaves shape is completed. An example of a procedure for forming the eaves shape will be described below.

Figure 4B:
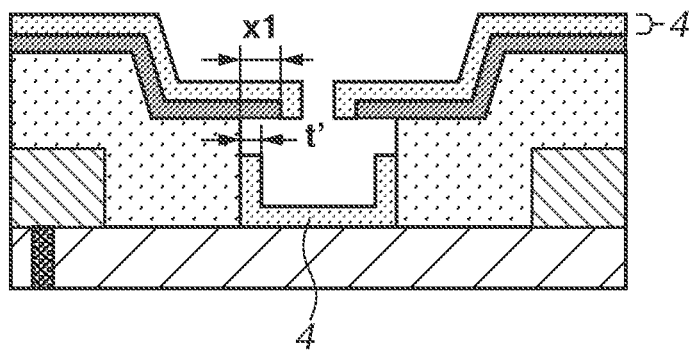
FIG. 4B is a diagram illustrating a state where the organic layer including the charge transport layer is deposited on the eaves shape.

FIG. 4B illustrates a state where the organic layer 4 including the charge transport layer is deposited on the eaves shape.

Figure 4C:
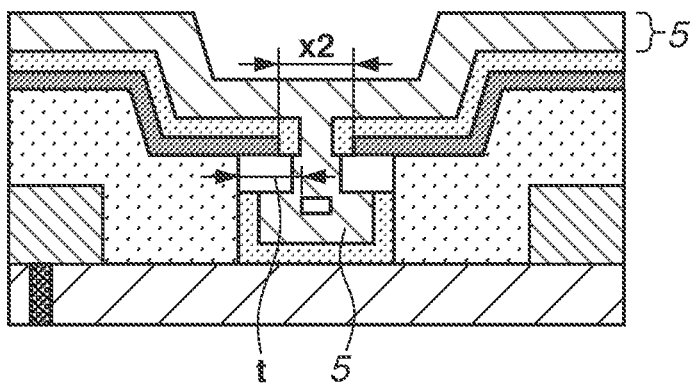
FIG. 4C is a diagram illustrating a state where an organic layer including the light-emitting layer is deposited after deposition of the organic layer including the charge transport layer.

FIG. 4C illustrates a state where the organic layer 5 including the light-emitting layer is deposited after deposition of the organic layer 4 including the charge transport layer.

Figure 4D:
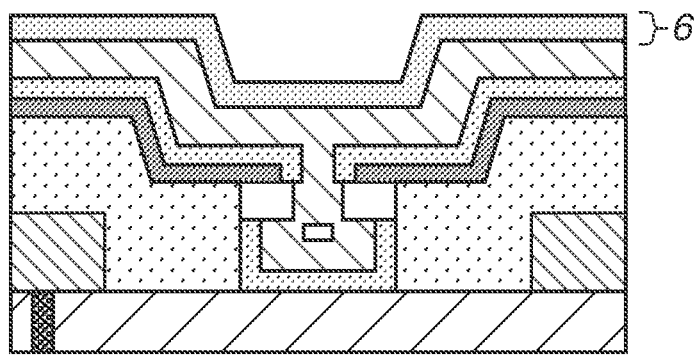
FIG. 4D is a diagram illustrating a state where an upper electrode is deposited after deposition of the organic layer including the light-emitting layer.

FIG. 4D illustrates a state where the upper electrode 6 is deposited after deposition of the organic layer 5 including the light-emitting layer.

To form the upper electrode 6 in a continuous form, the distance x2 between the leading edges of the eaves portion 11 may be filled between the processes illustrated in FIGS. 4B and 4C and the upper surface of the organic layer obtained before the upper electrode 6 is deposited may be formed in a continuous form at a level above the eaves shape between the light-emitting elements 10.

The thickness of the film deposited in the lateral direction of the upper portions 11a is equal to the thickness of the film deposited on each of the side surface portions 11b of the eaves shape.

In the lateral direction of the protruding portion of the eaves shape, the film is deposited from the right and left sides. In the case of using the point-source vapor deposition apparatus, the substrate 101 is rotated to uniformly deposit and form the film on the substrate 101. In the case of using the line-source vapor deposition apparatus, the line-source vapor deposition apparatus moves in parallel to the substrate 101. Thus, the thickness of the film deposited in the lateral direction of the protruding portion of the eaves shape can be made substantially uniform on the right and left sides.

As described above, when the distance x2 between the leading edges of the eaves portion 11 is designed to be smaller than twice the total film thickness t of the organic layer 4 including the charge transport layer and the organic layer 5 including the light-emitting layer to be deposited on the side surface portions 11b of the eaves shape, the organic film is formed in a continuous form between the leading edges of the eaves portion 11 during deposition of the organic layer 5 including the light-emitting layer [Condition 2].
[Condition 3]

If the distance x2 between the leading edges of the eaves portion 11 is small, there arises a concern that the organic layer 4 is formed in a continuous form between the leading edges of the eaves portion 11 during deposition of the organic layer 4 including the charge transport layer. Thus, the distance x2 is set to be greater than twice the film thickness t' of the organic layer 4 including the charge transport layer to be deposited on the side surface portions 11b of the eaves shape [Condition 3].

When the minimum value of the distance x2 is set while Condition 2 and Condition 3 are satisfied, the upper surface can be formed in a stable continuous form after deposition of the organic layer 5 including the light-emitting layer.
[Condition 4]

If the height y of the eaves portion 11 is smaller than the film thickness t' of the organic layer 4 including the charge transport layer, there arises a concern that the charge transport region is formed in a continuous form. Thus, the height y of the eaves portion 11 is set to be greater than the film thickness t' of the organic layer 4 including the charge transport layer [Condition 4].
[Condition 5]

If a large void is formed in the eaves shape, there arises a concern that the organic layer 5 including the light-emitting layer deposited at the leading edges of the eaves portion 11 falls into the eaves shape, and thus it may be desirable to form the eaves shape in such a manner that the inside of the eaves shape is filled to some extent to support the eaves shape from below. As a prevention measure, the protruding amount x1 of the eaves portion 11 is set to be smaller than the total film thickness t of the organic layer 4 including the charge transport layer and the organic layer 5 including the light-emitting layer to be deposited on the side surface portions 11b of the eaves portion 11 [Condition 5].

Condition 1 to Condition 5 are collectively represented by Inequality (1).

Figure 5A:
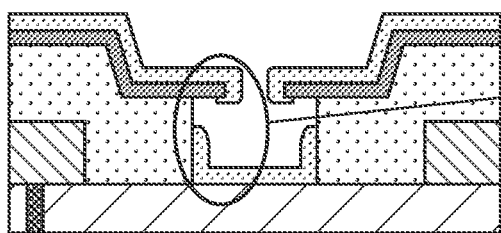
FIG. 5A is a diagram illustrating a state where a film thickness of the organic layer including a charge transport layer deposited on each side surface portion of the eaves shape is not uniform.
Figure 5B:
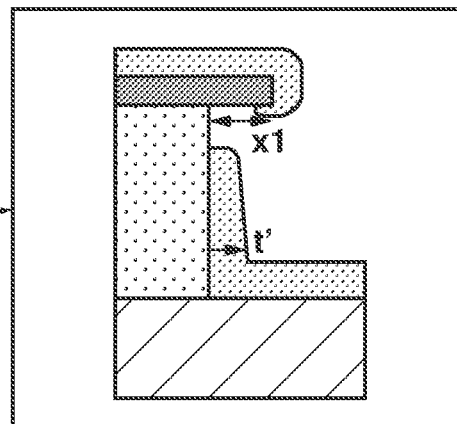
FIG. 5B is a diagram illustrating a partially enlarged view of FIG. 5A.
Figure 5C:
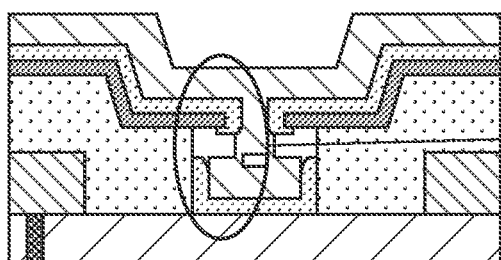
FIG. 5C is a diagram illustrating a state where a total film thickness of the organic layer including the charge transport layer and the organic layer including the light-emitting layer deposited on the side surface portions of the eaves shape is not uniform.
Figure 5D:
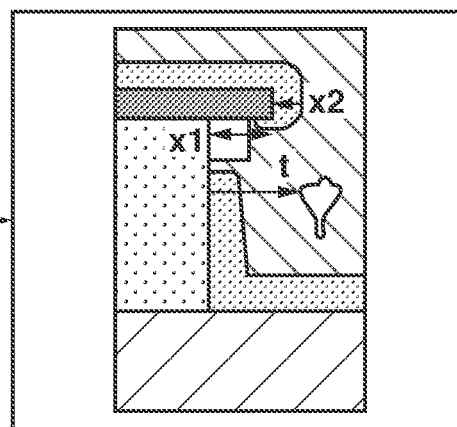
FIG. 5D is a diagram illustrating a partially enlarged view of FIG. 5C.

FIGS. 5A to 5D illustrate modified examples of the organic device according to an exemplary embodiment of the present disclosure. FIG. 5A illustrates a certain deposition state. FIG. 5B is a partially enlarged view of FIG. 5A. FIG. 5C illustrates another deposition state. FIG. 5D is a partially enlarged view of FIG. 5C.

FIG. 5A illustrates a state where the film thickness t' of the organic layer 4 including the charge transport layer deposited on the side surface portions 11b of the eaves shape is not uniform. FIG. 5C illustrates a state where the total film thickness t of the organic layer 4 including the charge transport layer and the organic layer 5 including the light-emitting layer deposited on the side surface portions 11b of the eaves shape is not uniform.

In these cases, considering the continuity and discontinuity conditions, it may be desirable to determine the protruding amount x1, the distance x2, and the height y to satisfy Inequality (1) where the film thickness t' of the organic layer 4 including the charge transport layer is set to a maximum value and the total film thickness t of the organic layer 4 including the charge transport layer and the organic layer 5 including the light-emitting layer is set to a minimum value.

An example of processes of manufacturing the organic device according to the present exemplary embodiment will be described below with reference to FIGS. 6A to 6I.

Figure 6A:
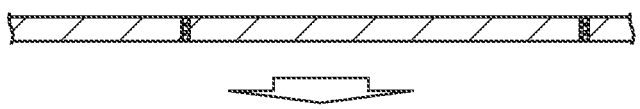
Figure 6C:
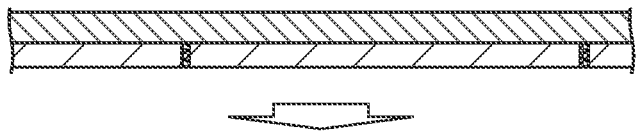

FIG. 6A illustrates a process of forming the layers up to the interlayer insulation layer 1 made of an insulating material on the substrate 101. FIG. 6B illustrates a process of depositing a metal film to form the lower electrode 2 on the interlayer insulation layer 1 by, for example, a physical vapor deposition (PVD) method or the like. FIG. 6C illustrates a process of coating a part of the metal film with resist or the like to protect the part of the metal film, and then etching the metal film by dry or wet etching, to form the lower electrode 2.

Figure 6D:

FIG. 6D illustrates a process of depositing a material to form the partition 3 on the lower electrode 2. As an insulation film serving as the side surface portions 11b of the eaves shape, an organic material, such as thermosetting resin or thermoplastic resin, is deposited.

In this process, use of an apparatus, such as a coater developer, makes it possible to deposit the material with a desired thickness by appropriately determining the number of rotations during coating of the material. The material may be formed into a film shape and may be caused to adhere to a front surface with a desired thickness.

Figure 6E:
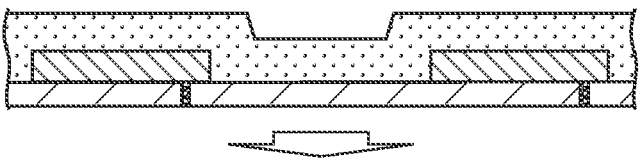

FIG. 6E illustrates a process of depositing an insulation film serving as the upper portions 11a of the eaves portion 11 in the partition 3 by a chemical vapor deposition (CVD) method and applying resist to remove the partition 3 except for the opening region. To define the opening region above the lower electrode 2, a protective resist 13 is patterned on a region other than the required opening region by a photolithography method.

In the photolithography method, resist containing novolac resin and an i-line exposure machine, or chemical amplified resist and an extreme ultraviolet (EUV) exposure machine using an argon fluoride (ArF) or krypton fluoride (KrF) laser can be used.

Figure 6F:
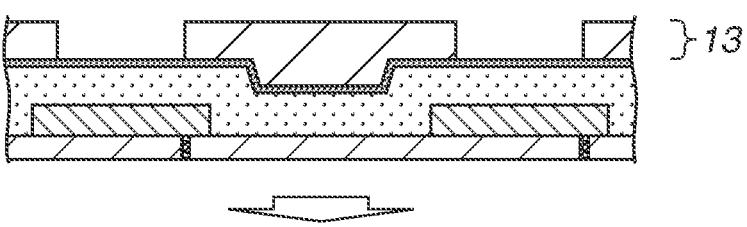

As illustrated in FIG. 6F, since the upper electrode 6 is to be formed in a continuous form on the opening region above the lower electrode 2, it is desirable that the partition 3 on the lower electrode 2 is formed into a gently forward-tapered shape.

In the case of EUV exposure, a pattern edge of the protective resist 13 has a vertically sharp shape. Accordingly, it may be desirable to form the protective resist 13 by dry etching with high anisotropy to prevent the side surface of the partition 3 from being etched after the protective resist 13 is patterned by the i-line exposure machine.

Figure 6G:
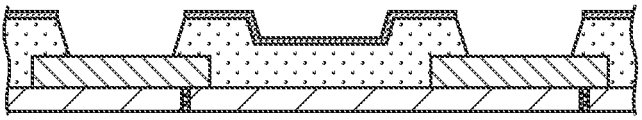

FIG. 6G illustrates a state where a pattern for forming the eaves portion 11 is formed. The protective resist 13 is patterned in the region other than the eaves portion 11 by the photolithography method. In this process, the exposure machine to be used is determined based on the distance x2 between the leading edges of the eaves portion 11. When the distance x2 is 0.35 μm or more, the i-line exposure machine can be used. When the distance x2 is less than or equal to 0.35 μm, the EUV exposure machine can be used.

Figure 6H:
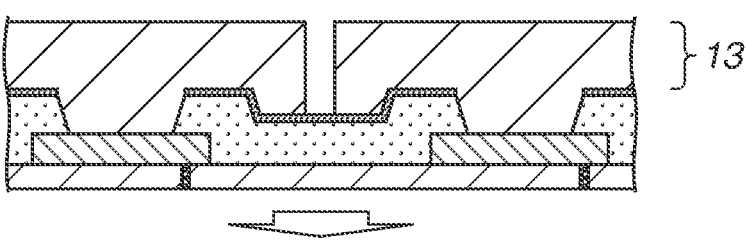

FIG. 6H illustrates a process of removing the partition upper portion 3b and the partition portion 3a that form the partition 3 in the eaves portion 11 by sequentially etching the partition upper portion 3b and the partition portion 3a. In this process, it may be desirable to use the condition with high anisotropy, like in the case of forming the lower electrode 2.

Figure 6I:
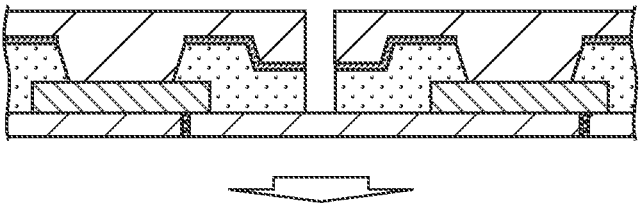

FIG. 6I illustrates a process of performing an additional etching process on the side surface portions 11b of the eaves shape to ensure the protruding amount x1 of the eaves portion 11. In this process, dry or wet etching can be used and the condition with high isotropy is used for processing in the lateral direction. Further, since the distance x2 between the leading edges of the eaves portion 11 and the height y of the eaves portion 11 are determined in the above-described processes, the etching condition in which the etching rate of the partition upper portion 3b and the interlayer insulation layer 1 is extremely smaller than that of the material forming the partition portion 3a is used.

The etching processes illustrated in FIGS. 6H and 6I can be carried out in one process by dry etching, instead of carrying out the above-described two processes. In this case, the partition upper portion 3b is removed in the condition with high anisotropy, and then the condition is changed to the condition with high isotropy and etching is continuously performed until the desired protruding amount x1 is obtained. The distance x2 between the leading edges of the eaves portion 11 is determined when the partition upper portion 3b is removed. Accordingly, during etching of the partition upper portion 3b, the etching condition in which the etching rate of the partition upper portion 3b is smaller than that of the partition portion 3a is used.

To determine the above-described etching condition, the insulating material of the partition portion 3a forming the side surface portions 11b of the eaves shape may be desirably different from the insulating material of the interlayer insulation layer 1 forming the partition upper portion 3b that forms the upper portion of the partition 3 and the bottom portion 11c of the eaves portion 11.

To increase the height y of the eaves portion 11, the interlayer insulation layer 1 forming the bottom portion 11c of the eaves portion 11 may also be etched in the etching process for ensuring the protruding amount x1. In this case, different insulating materials may be selected as the insulating material to form the partition upper portion 3b that forms the upper portion of the partition 3 and the insulating material to form the interlayer insulation layer 1 to form the bottom portion 11c of the eaves portion 11.

Figure 7:
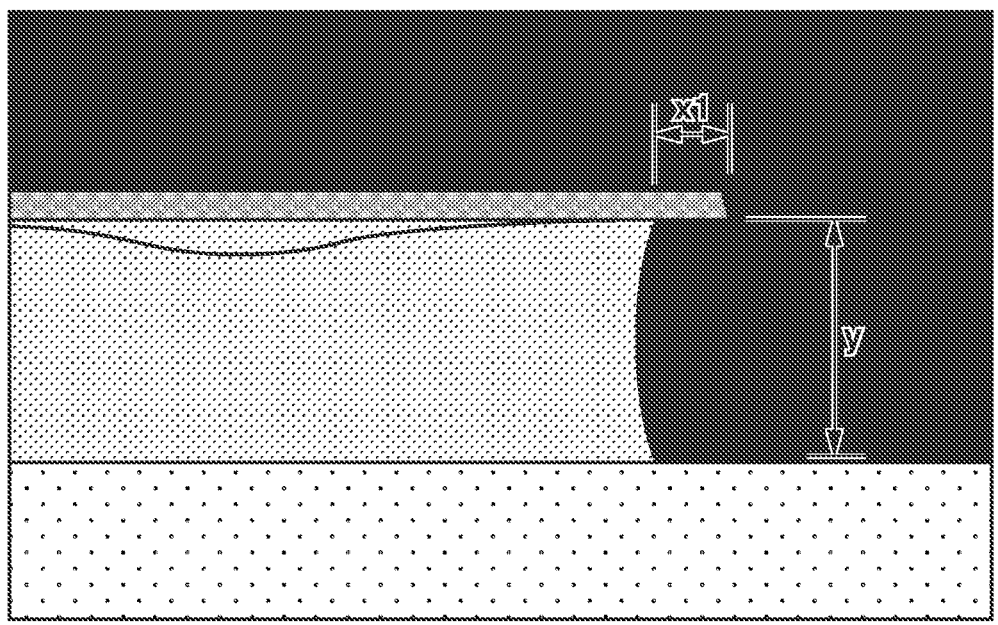
FIG. 7 is an electron micrograph diagram illustrating the eaves shape of the organic device according to the first exemplary embodiment.

FIG. 7 is an electron micrograph diagram illustrating the eaves shape of the organic device according to an exemplary embodiment of the present disclosure. The interlayer insulation layer 1 and the partition upper portion 3b serving as the protruding portion of the eaves shape is prepared using an inorganic insulation film, and the partition portion 3a serving as the side surface portion of the eaves shape is prepared using an organic insulation film. In this case, the protruding amount x1 of the eaves portion 11 is 0.24 μm and the height y of the eaves portion 11 is 0.8 μm.

Figure 8A:
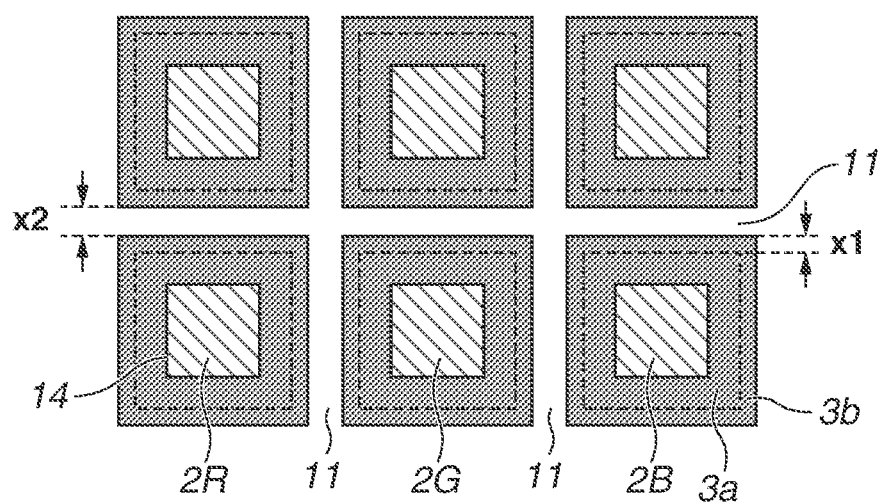
FIG. 8A is a diagram illustrating an example of the organic device including quadrangular lower electrodes.
Figure 8B:
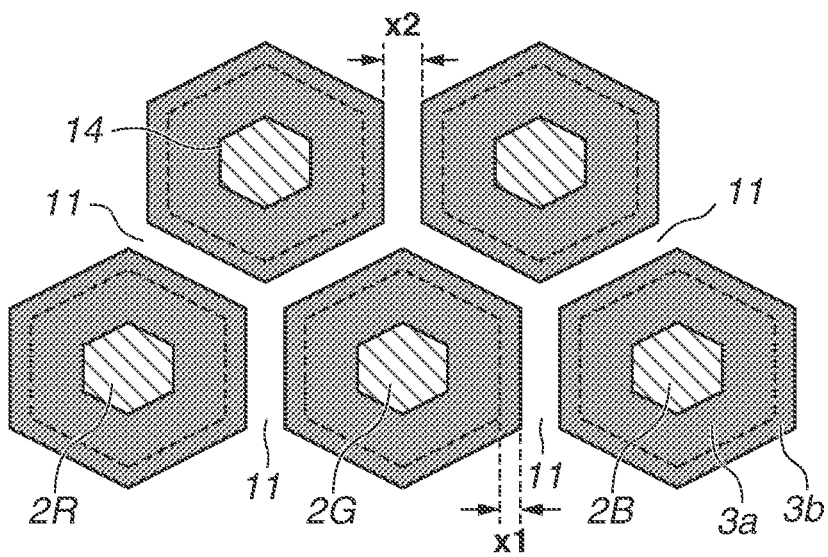
FIG. 8B is a diagram illustrating an example of the organic device including hexagonal lower electrodes.

FIGS. 8A and 8B are plan views each illustrating the shape of the organic device according to an exemplary embodiment of the present disclosure.

FIG. 8A illustrates the organic device including the lower electrodes 2 having a quadrangular shape. The lower electrodes 2, the partition 3, and an opening portion 14 of the partition 3 each have a quadrangular shape. Accordingly, a light-emitting region also has a quadrangular shape. The shapes of the components illustrated in FIG. 8A are merely examples, and some of the components may have a shape other than a quadrangular shape.

FIG. 8B illustrates an example where the organic device includes the lower electrodes 2 having a hexagonal shape. While, in this example, the lower electrodes 2 each have a hexagonal shape, the lower electrodes 2 may have a polygonal shape other than a hexagonal shape. While, in this example, the partition 3 and an opening portion 14 of the partition also have a hexagonal shape, any of the partition 3 and an opening portion 14 may have a shape other than a hexagonal shape.

Figure 8C:
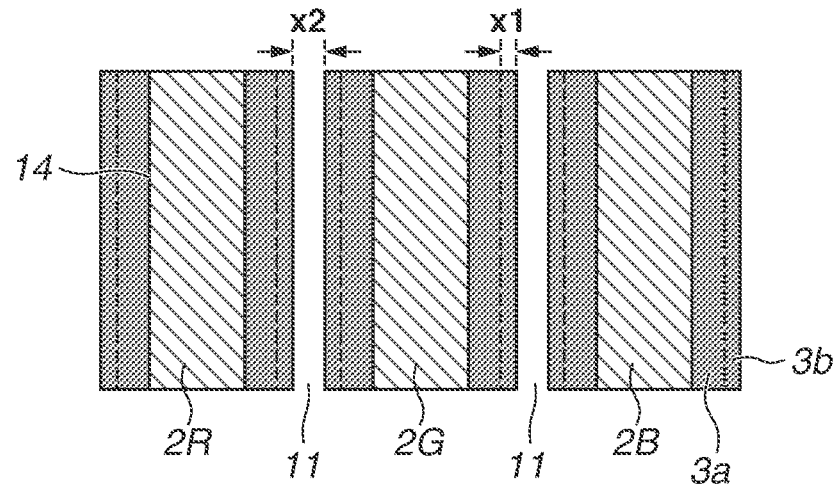
FIG. 8C is a diagram illustrating an example of the organic device including quadrangular lower electrodes and also illustrating an example of a stripe array.

FIG. 8C illustrates an example where the organic device includes the lower electrodes 2 having a quadrangular shape. This is a so-called a stripe array. A configuration in which a part of each of the lower electrodes 2 is not covered with the partition 3 unlike in the example illustrated in FIG. 8C can also be used.

Figure 9A:
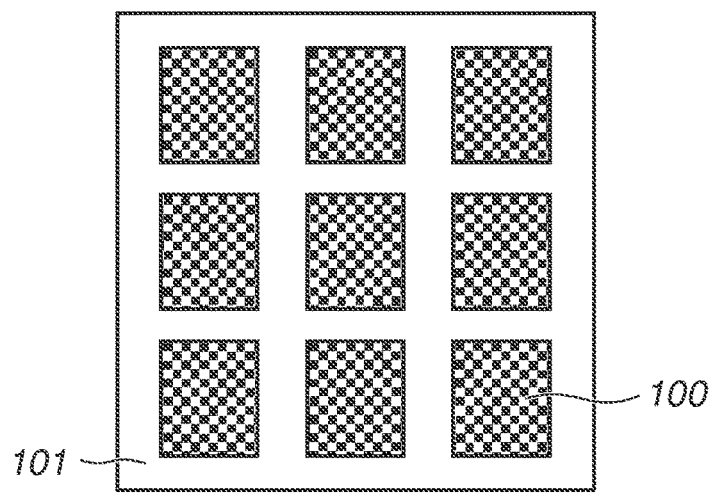
FIG. 9A is a diagram illustrating an example where a plurality of organic devices is disposed on a quadrangular substrate.
Figure 9B:
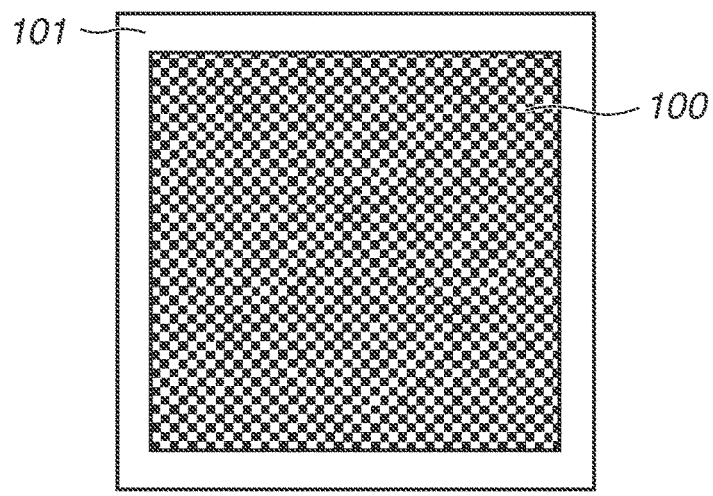
FIG. 9B is a diagram illustrating an example where a single organic device is disposed on a single quadrangular substrate.
Figure 9C:
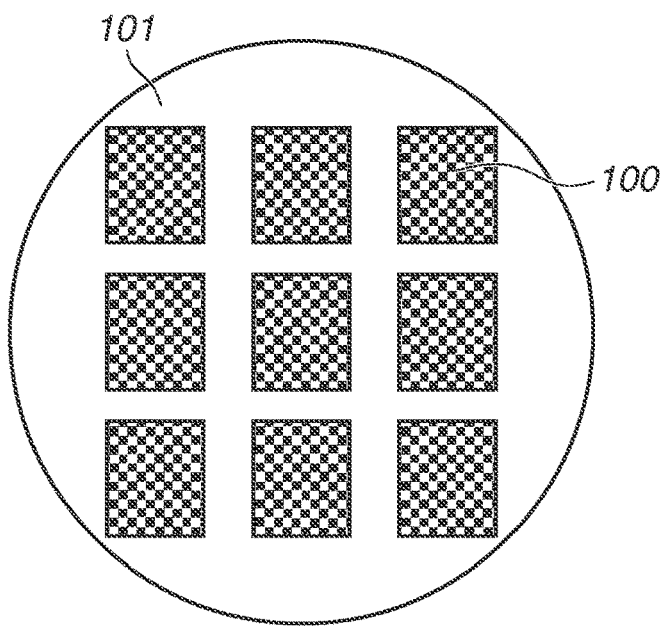
FIG. 9C is a diagram illustrating an example where a plurality of organic devices is disposed on a circular substrate.

FIGS. 9A to 9C each illustrate a positional relationship and an inclusive relationship between the substrate 101 and organic devices. FIG. 9A illustrates a state where a plurality of organic devices is disposed on the substrate 101 having a quadrangular shape. A plurality of organic devices is manufactured on a single substrate 101. A plurality of elements is disposed in each of the organic devices. While FIG. 9A illustrates nine organic devices, the number of organic devices is not limited to nine.

FIG. 9B illustrates an example where a single organic device is disposed on a single quadrangular substrate 101.

Also, in this organic device, a plurality of elements is disposed in a single organic device.

FIG. 9C illustrates an example where a plurality of organic devices is disposed on the substrate 101 having a circular shape. While FIG. 9C illustrates an example where nine organic devices are disposed, the number of organic devices may be one, or more than nine.

Normal crucibles can be used as the crucibles used in the present exemplary embodiment. Examples of normal crucibles include crucibles discussed in Japanese Patent Application Laid-Open Nos. 2011-21223 and 2014-65973. However, the types of crucibles to be used are not limited to these examples. If there is a concern about bumping of a vapor deposition material, a crucible to be described below can be used. Bumping of the vapor deposition material is also called spitting.

Figure 10A:
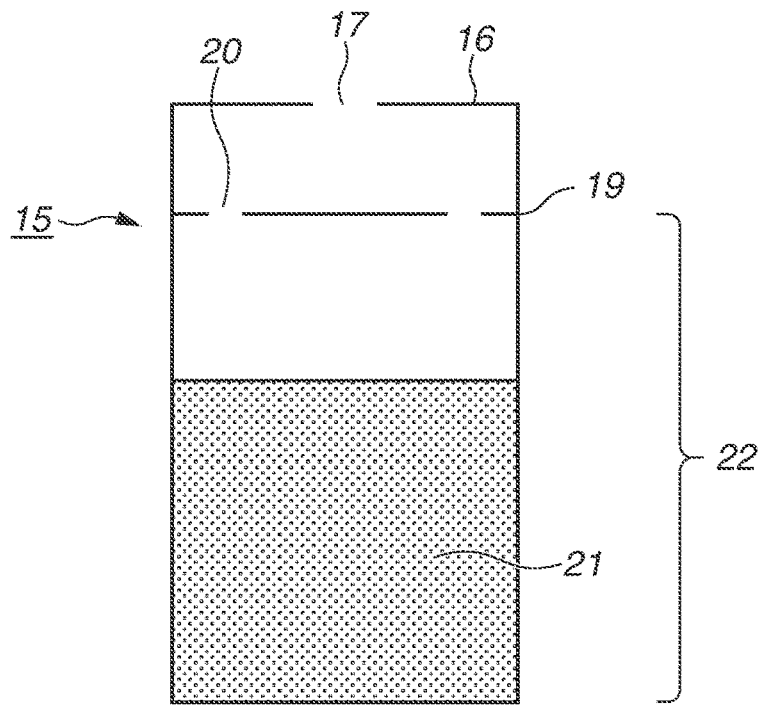
FIG. 10A is a schematic sectional view illustrating a crucible of related art.
Figure 10B:
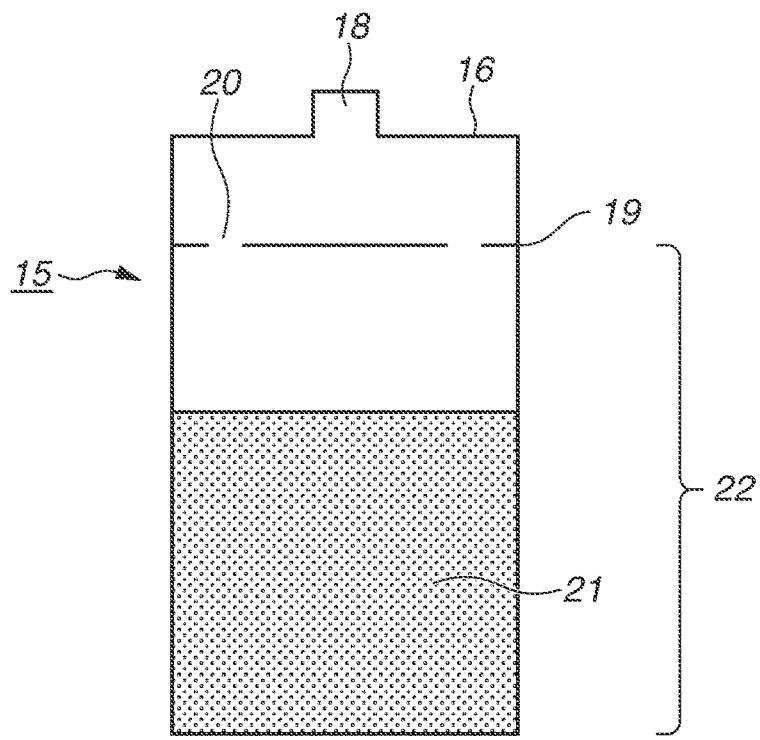
FIG. 10B is a schematic sectional view illustrating another example of the crucible of related art.

A crucible of related art illustrated in FIGS. 10A and 10B includes a single middle cover 19 to reduce the adverse effect of spitting due to bumping. FIG. 10A illustrates a crucible 15 including a top cover 16, a top cover opening 17, the middle cover 19, a middle cover opening 20, a vapor deposition material 21, and a vapor deposition material accommodation space 22. The middle cover 19 includes one or more middle cover openings 20 through which vaporized vapor deposition particles pass. Depending on the position of the middle cover openings 20, spitting cannot be fully reduced, and thus a crucible which can further reduce spitting may be used.

FIG. 10B is similar to FIG. 10A except that the top cover opening 17 is replaced by a top cover nozzle 18.

Figure 11A:
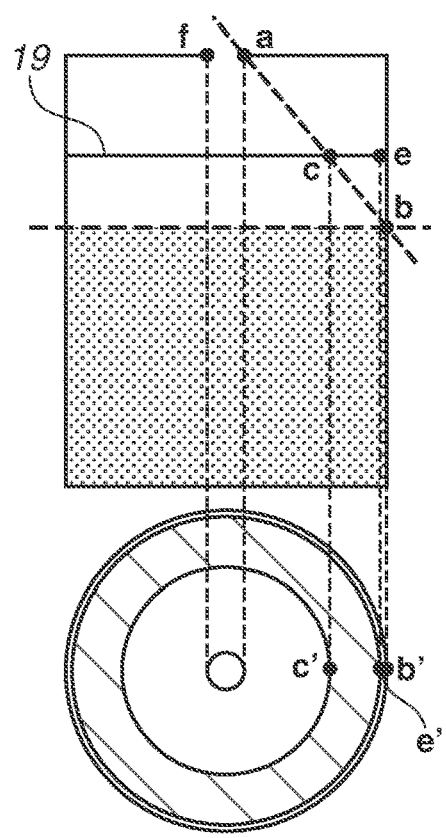
FIG. 11A is a diagram illustrating an example where the crucible has a circular shape as viewed from the top.
Figure 11B:
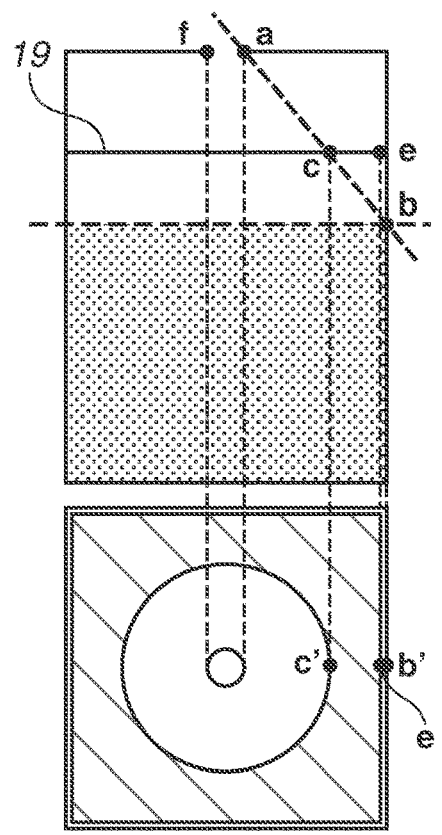
FIG. 11B is a diagram illustrating an example where the crucible has a quadrangular shape as viewed from the top.

FIGS. 11A and 11B each illustrate a range in which the middle cover opening 20 of the middle cover 19 can be provided. FIG. 11A illustrates an example where the crucible has a circular shape as viewed from the top. FIG. 11A also illustrates a top view corresponding to the lower portion of the sectional view of the crucible. Points "a" to "f" in the sectional view respectively correspond to the point "a" to point "f" in the top view. Dotted lines indicate the correspondence between the respective points. A range in which the middle cover opening 20 of the middle cover 19 can be provided corresponds to a range indicated by a line connecting the points "c" and "e" in FIGS. 11A and 11B, that is, a portion indicated by a shaded area in the top view of the crucible 15. The range in which the middle cover opening 20 of the middle cover 19 can be provided is also referred to as an opening formation range.

The opening formation range of the middle cover 19 is obtained as follows. In the sectional views of FIGS. 11A and 11B, the point "a" on the top cover opening 17 and the point "b" on the accommodation upper limit of the vapor deposition material in the crucible 15 are connected with a straight line. When an intersection between the straight line and the middle cover 19 is represented by "c" and the point "e" is on the middle cover 19, the opening formation range corresponds to the range from the point "c" to the point "e". The point "e" is a point on the middle cover 19, but an end of the middle cover 19 is excluded. This is because the width for installing the middle cover 19 is required in the crucible 15, and thus it is not desirable to provide the opening at an end.

Figure 12A:
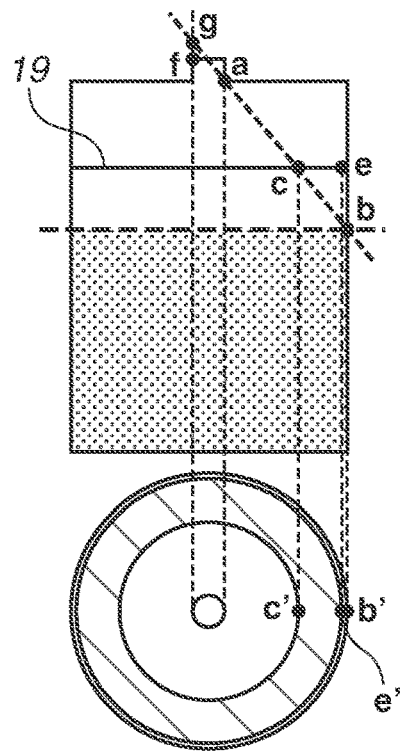
FIGS. 12A to 12C are diagrams each illustrating a modified example of the crucible which achieves reduction in spitting.
Figure 12B:
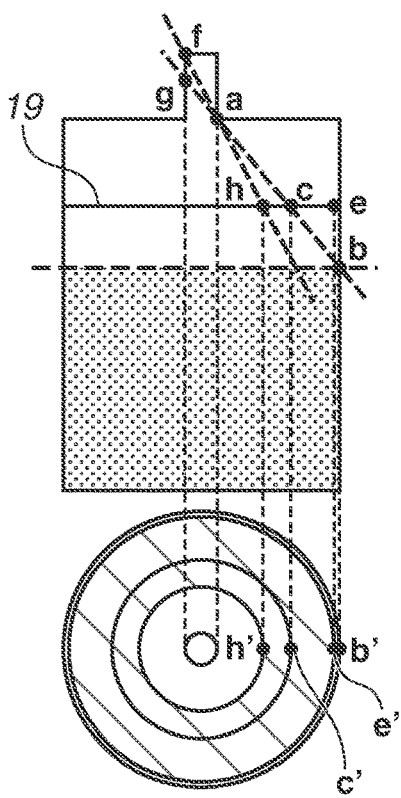
Figure 12C:
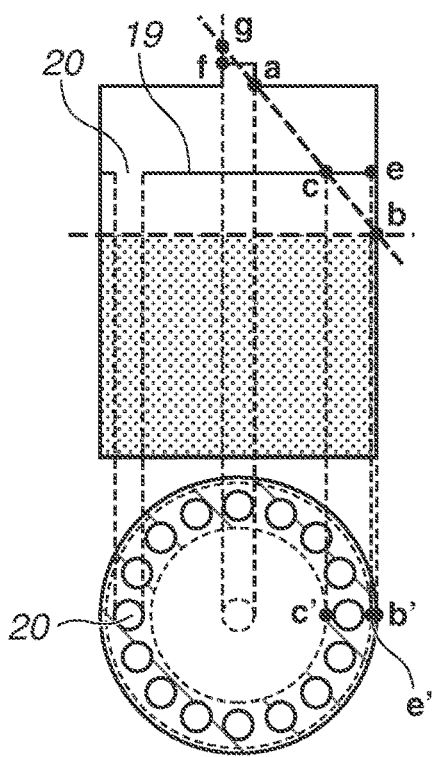

FIGS. 12A to 12c each illustrate a modified example of the crucible which achieves reduction in spitting. FIG. 12A illustrates the crucible including a nozzle. In FIG. 12A, an intersection between a straight line connecting the points "a" and "b" and an extension from the upper end "f" of the nozzle to the top of the nozzle is represented by "g". When the point "g" is above the nozzle upper end "f", the opening formation range is determined based on the straight lines a-b, like in the case where no nozzle is provided.

On the other hand, when the point "g" is below the nozzle upper end "f" as illustrated in FIG. 12B, an intersection between a straight line connecting the point "a" and the upper end "f" and the middle cover 19 is represented by "h". The opening formation range corresponds to a range from the point "h" to the point "e". On the contrary, an opening non-formation range on the middle cover 19 is an unshaded region in the top view of the crucible illustrated in FIGS. 11A and 11B and FIGS. 12A to 12C. This is because if the opening is formed within the circular shape in the top view, the vapor deposition material in the crucible travels straight and reaches the substrate 101 provided above the crucible. If the opening is provided at an undesirable position, spitting due to bumping or the like directly reaches the substrate 101, which makes it difficult to uniformly form a film. This causes deterioration in production yield. As described above, the opening provided in the middle cover 19 depends on the section of the crucible in the horizontal direction and the opening area of the top cover 16 and is thus limited.

FIG. 12C illustrates an example where a plurality of openings is formed in a middle cover 19. Circular openings are provided physically as much as possible in the opening formation range of the middle cover 19. In this case, the temperature at a point c' in the top view of the crucible may decrease. The temperature of the middle cover 19 is determined based on heat conduction from the point b'. However, since openings are provided as much as possible between the point b' and the point c', there arises a possibility that the amount of conducted heat decreases and the temperature at the central portion decreases. If the temperature at the central portion decreases, the vapor deposition particles adhere to the middle cover 19 and a crystal is grown, which may result in closing of the openings. In this case, vapor deposition is stopped.

Figure 13A:
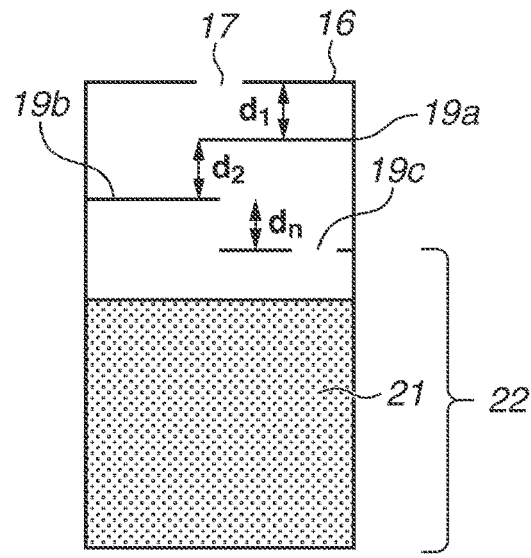
FIG. 13A is a schematic sectional view illustrating a more desirable crucible to manufacture the organic device according to the first exemplary embodiment.
Figure 13B:
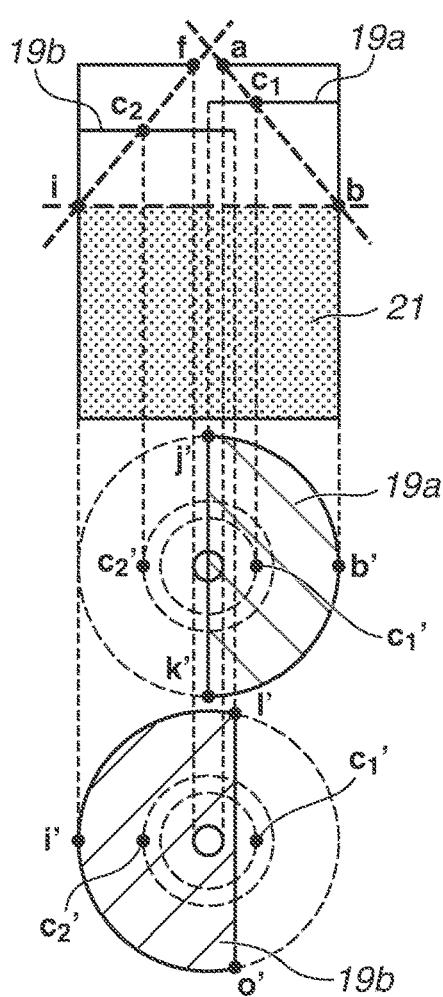
FIGS. 13B and 13C are top views each illustrating the crucible.
Figure 13C:
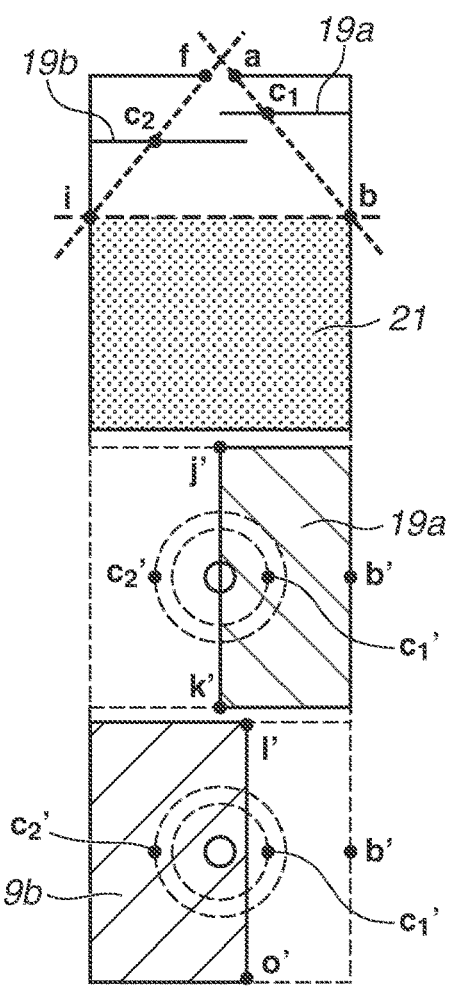

FIGS. 13A to 13C are diagrams each illustrating a more desirable crucible to manufacture the organic device according to the present exemplary embodiment.

FIG. 13A is a sectional view of the crucible. The crucible includes a first middle cover 19a, a second middle cover 19b, and a third middle cover 19c, which include regions overlapping each other in the vertical direction of the crucible. The number of middle covers is not particularly limited, as long as two or more middle covers are used. Preferably, five or fewer middle covers are used, and more preferably, three or fewer middle covers are used.

FIG. 13B illustrates a sectional view and top views of the crucible including two middle covers. The upper side of the two top views illustrates an orthogonal projection of the first middle cover 19a on the bottom surface, and a shaded portion corresponds to an orthogonal projection of the first middle cover 19a on the bottom surface. The lower side of the two top views illustrates an orthogonal projection of the second middle cover 19b on the bottom surface, and a shaded portion corresponds to the orthogonal projection of the second middle cover 19b on the bottom surface. The total region of the orthogonal projection of the first middle cover 19a and the orthogonal projection of the second middle cover 19b include the orthogonal projection of the bottom surface of the opening on the top cover 16.

As illustrated in FIG. 13B, the bottom surface of the crucible has a circular structure. An end "a" of the top cover opening and a portion "b" where the uppermost surface of the vapor deposition material is in contact with the side surface of the crucible when the maximum amount of vapor deposition material that can be accommodated in the crucible is accommodated are connected with a straight line. An intersection between the straight line and the first middle cover 19a counted from the top cover 16 is represented by $c_1$. The inside of the circle including the intersection $c_1$ on the circumference thereof corresponds to the opening non-formation range of the first middle cover 19a. The opening non-formation range cannot be completely covered only with the first middle cover 19a. In other words, the accommodated vapor deposition material can be directly observed from a part of the opening of the top cover 16. In this case, the illustrated structure includes the second middle cover 19b. The end "f" of the top cover opening and the portion "i" where the uppermost surface of the vapor deposition material is in contact with the side surface of the crucible when the maximum amount of vapor deposition material that can be accommodated in the crucible is accommodated are connected with a straight line. An intersection between the straight line and the second middle cover 19b counted from the top cover 16 is represented by $c_2$. The inside of the circle including the intersection $c_2$ on the circumference thereof corresponds to the opening non-formation range of the second middle cover 19b. In other words, the opening non-formation range that cannot be covered only with the first middle cover 19a is covered with the second middle cover 19b. On the contrary, the opening non-formation range that cannot be covered only with the second middle cover 19b is covered with the first middle cover 19a. That is, in this structure, the accommodated vapor deposition material cannot be directly observed from the opening of the top cover 16.

All the middle covers have a structure in which a part of the circumference of the middle cover is not in contact with the inner wall of the crucible.

A desirable crucible according to the present exemplary embodiment includes a top cover including an opening, and a plurality of middle covers disposed below the opening portion of the top cover in the vertical direction. As illustrated in FIG. 13A, when a gap interval between the top cover and the middle covers immediately below the top cover and a gap interval between the plurality of middle covers in the vertical direction are each represented by $d_1$, $d_2$, $d_3$, and . . . $d_n$ ($d_n$ represents the gap between the (n−1)th middle cover and the n-th middle cover counted from the top cover) counted from the top cover, the gap interval $d_n$ satisfies Inequality (2).

$$d_n > 0 [mm] \quad (2)$$

Further, the entire region of the opening of the top cover overlaps the plurality of middle covers in a plan view. One of the middle covers may overlap the entire region of the opening of the top cover, or the overlapping regions of the plurality of middle covers may be combined to overlap the entire region of the opening of the top cover. This structure makes it possible to prevent spitting due to bumping of the vapor deposition material from directly reaching the substrate.

In a configuration in which the total region of the orthogonal projection of the first middle cover 19a and the orthogonal projection of the second middle cover 19b includes the orthogonal projection of the bottom surface of the opening on the top cover, the middle covers may be provided with no openings.

Specifically, at j'-k' and l'-o' on the first middle cover 19a and the second middle cover 19b, respectively, no middle cover is provided in a region with no oblique lines, whereby the need to form an opening in the middle cover can be eliminated. Thus, a plurality of middle covers is disposed and a region where no middle covers are disposed is provided, whereby it makes possible to cover the opening non-formation range using a combination of other middle covers. In the desirable crucible, the degree of decrease in the temperature at the central portion of each middle cover due to openings in the opening formation region on the middle cover, that is, the openings surrounding the opening non-formation range is small. Since the desirable crucible eliminates the need for forming openings to surround the opening non-formation range, a decrease in the temperature at the central portion of each middle cover can be prevented. It is also possible to form openings in the middle covers to such an extent that the temperature at the central portion is not decreased.

In a more desirable crucible, a relationship among an area D of the opening portion of the top cover, a section M in the horizontal direction of the crucible, and an area $m_n$ (n represents the n-th middle cover counted from the top cover) of the middle cover satisfies Inequality (3).

$$M - m_n \geq D \quad (3)$$

When the vapor deposition material is accommodated in an airtight container and is heated, the material is vaporized into vapor deposition particles, and consequently the internal pressure in the container increases. For example, when the container has an opening on the upper surface of the top cover, the internal pressure decreases as the size of the opening increases at a constant heating temperature. In vacuum vapor deposition, it is general to provide the middle cover below the top cover in the vertical direction to prevent spitting of deposition particles due to bumping of the material from reaching the substrate. For example, in the case of forming a film under a state where a certain vapor deposition rate is obtained at a substrate position, when Inequality (3) is satisfied, the effect of the opening area of the top cover on the pressure in the crucible increases. On the other hand, when Inequality (4) is satisfied, the effect of the opening area of the middle cover on the pressure in the crucible increases.

$$M - m_n < D \quad (4)$$

In other words, to obtain the same vapor deposition rate at the substrate position, in the process in which vaporized vapor deposition particles reach in the following order; vapor deposition material accommodation space 22, middle cover opening 20, top cover opening 17, and substrate, the internal pressure in the vapor deposition material accommodation space 22 in the latter case is higher than that in the former case. Accordingly, excessive heating of the vapor deposition material causes a side reaction, such as decomposition of the vapor deposition material, which leads to a decrease in the purity of the film formed on the substrate.

In the desirable crucible, the adverse effect of spitting on the vapor-deposited substrate is small even if spitting occurs during vapor deposition. In the case of forming a film at the same vapor deposition rate at the substrate position, the pressure in the crucible is decreased, or the vapor deposition temperature is decreased, to make it possible to suppress the side reaction, such as decomposition of the vapor deposition material.

EXAMPLES

Examples of the crucible according to the present exemplary embodiment will be described below. In the examples, two types of materials, that is, a vapor deposition material A and a vapor deposition material B, which can be relatively easily decomposed, were used. As material represented by the following Inequality (5) is used as the material that can be relatively easily decomposed at a vacuum degree P of $1 \times 10^{-4} \leq P \leq 1 \times 10^{-3}$ [Pa].

$$\Delta |T_b - T_s| < 40 [°C] \quad (5)$$

In Inequality (4), $T_b$ represents a decomposition temperature and $T_s$ represents a sublimation start temperature. The vapor deposition material A is a compound with a carbon-nitrogen bond, and the vapor deposition material B is a metal complex compound.

Crucibles and middle covers having the sectional structures illustrated in FIGS. 10A and 10B were used in comparative example. A sample used for analysis was obtained by forming a film of each vapor deposition material at a substrate position with a thickness of 300 [Å] at a vapor deposition rate of 1.0 [Å/sec]. This single-layer film was dissolved in a soluble solvent and was analyzed by High Performance Liquid Chromatography (HPLC manufactured by SHIMADZU CORPORATION).

TABLE 1

| | Middle Cover Structure | | Deposition Material | Material Initial Purity [%] | Single Film Purity [%] | Residual Purity in Crucible [%] |
|---|---|---|---|---|---|---|
| | Number | Opening | | | | |
| Example 1 | 2 | Absent | A | 99.64 | 99.65 | 99.60 |
| Example 2 | 2 | Present | A | 99.64 | 99.70 | 99.65 |
| Example 3 | 2 | Present | B | 98.76 | 99.88 | 99.90 |
| Example 4 | 3 | Absent | B | 98.76 | 98.80 | 98.75 |
| Example 5 | 3 | Present | A | 99.64 | 99.66 | 99.64 |
| Example 6 | 3 | Present | B | 98.76 | 98.79 | 98.77 |

TABLE 1-continued

| | Middle Cover Structure | | Deposition Material | Material Initial Purity [%] | Single Film Purity [%] | Residual Purity in Crucible [%] |
|---|---|---|---|---|---|---|
| | Number | Opening | | | | |
| Comparative Example 1 | 1 | Present | A | 99.64 | 98.62 | 98.03 |
| Comparative Example 2 | 1 | Present | B | 98.76 | 98.02 | 97.98 |

While, in Examples 1 to 6, the middle cover is provided with a plurality of openings, a decrease in the temperature of the middle cover was not observed. When the desirable crucible was used, it was confirmed that a single-layer film with higher purity than the material initial purity obtained before the material was used for vapor deposition can be formed when each of the vapor deposition materials A and B was used. On the other hand, when vapor deposition was conducted with the crucible of related art used in comparative examples, it was confirmed that the purity of the single-layer film and the purity of the residual in the crucible were much lower than the material initial purity before vapor deposition.

Furthermore, a state where adhesion of the material by spitting due to bumping or the like onto the substrate was checked using the desirable crucible. Mg was used as the vapor deposition material and a film was formed on the substrate with a thickness of 100 nm at a vapor deposition rate of 1.0 Å/sec. The number of foreign materials with a size of 1 μm or larger was counted using WM7 (manufactured by Takano Corporation).

TABLE 2

| | Middle Cover Structure | | | |
|---|---|---|---|---|
| | Number | Presence or Absence of Middle Cover Opening | Deposition Material | Number of Foreign Materials on Wafer |
| Example 7 | 2 | Absent | Mg | 0 |
| Example 8 | 2 | Present | Mg | 0 |

It was confirmed that the desirable crucible is excellent in preventing spitting due to bumping.

An example of an organic light-emitting element will be described below as a preferable application example of a device manufactured using the organic device and the desirable crucible according to an exemplary embodiment of the present disclosure.

[Configuration of Organic Light-Emitting Element]

An organic light-emitting element is provided by forming an insulation layer, a first electrode, an organic compound layer, and a second electrode on a substrate. A protective layer, a color filter, a microlens, and the like may be provided on the second electrode. When the color filter is provided, a planarization layer may be provided between the color filter and the protective layer. The planarization layer can be made of acrylic resin or the like. The same holds true when the planarization layer is provided between the color filter and the microlens.

[Substrate]

Examples of the substrate include quartz, glass, a silicon wafer, resin, and metal. On the substrate, switching elements, such as transistors, and wires may be provided, and an insulation layer may be provided on the switching elements and wires. The material of the insulation layer is not particularly limited as long as a contact hole can be formed to dispose a wire between the insulating layer and the first electrode and the material can ensure insulation from a wire that is not to be connected. For example, a resin, such as polyimide, silicon oxide, or silicon nitride can be used.

[Electrodes]

A pair of electrodes can be used. The pair of electrodes may include an anode and a cathode.

When an electric field is applied in a direction in which the organic light-emitting element emits light, the electrode with a higher potential corresponds to the anode and the other electrode corresponds to the cathode. In other words, the electrode for supplying holes to the light-emitting layer corresponds to the anode and the electrode for supplying electrons corresponds to the cathode.

As the constituent material of the anode, a material having a large work function can be used. For example, metal, such as gold, platinum, silver, copper, nickel, palladium, cobalt, selenium, vanadium, or tungsten, a mixture containing some of them, an alloy obtained by combining some of them, or a metal oxide, such as tin oxide, zinc oxide, indium oxide, indium tin oxide (ITO), or zinc indium oxide, can be used as the anode. Further, a conductive polymer, such as polyaniline, polypyrrole, or polythiophene, can also be used as the anode.

One of these electrode materials may be used singly, or two or more of them may be used in combination. The anode may be formed of a single layer or a plurality of layers.

When the anode is used as a reflective electrode, for example, chromium, aluminum, silver, titanium, tungsten, molybdenum, an alloy thereof, or a stacked layer thereof can be used. The anode can also function as a reflective layer that does not function as an electrode in the above-described materials. When the anode is used as a transparent electrode, an oxide transparent conductive layer made of ITO, indium zinc oxide, or the like can be used. However, the anode is not limited to these examples.

A photolithography technique can be used to form the electrodes.

As the constituent material of the cathode, a material having a small work function can be used. Examples of the material include an alkali metal, such as lithium, an alkaline earth metal, such as calcium, metal, such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, or a zinc-silver alloy can be used. A metal oxide, such as ITO, can also be used. One of these electrode materials may be used singly, or two or more of them may be used in combination. The cathode may have a single-layer structure or a multilayer structure. For the cathode, silver may be desirably used, or a silver alloy may be more desirably used to suppress aggregation of silver. The ratio of the alloy is not limited as long as aggregation of silver can be suppressed. For example, the ratio between silver and a material other than silver may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited. However, it may be more desirable to use direct current sputtering or alternating current sputtering, because an excellent film coverage is obtained and the resistance is easily lowered.

[Organic Compound Layer]

An organic compound layer may be formed of a single layer or a plurality of layers. When the organic compound layer includes a plurality of layers, the layers include a hole injection layer, a hole transport layer, an electron blocking layer, a light-emitting layer, a hole blocking layer, an electron transport layer, and an electron-injection layer, which have different functions, respectively. The organic compound layer is mainly made of an organic compound, but instead may include an inorganic atom or an inorganic compound. For example, the organic compound layer may include copper, lithium, magnesium, aluminum, indium, platinum, molybdenum, or zinc. The organic compound layer may be disposed between the first electrode and the second electrode, and may be formed in contact with the first electrode and the second electrode.

[Protective Layer]

A protective layer may be provided on the cathode. For example, glass coated with absorbent is bonded onto the cathode to reduce the immersion of water or the like into the organic compound layer, which leads to a reduction in the occurrence of a display failure. In another exemplary embodiment, a passivation film made of silicon nitride or the like may be disposed on the cathode to reduce the immersion of water or the like into the organic compound layer. For example, after the cathode is formed, the cathode may be transported to another chamber in the vacuum state, and a silicon nitride film may be formed with a thickness of 2 μm by the CVD method, to dispose the protective layer. After the film is formed by the CVD method, the protective layer may be disposed by an atomic layer deposition (LAD) method. The material of the film formed by the ALD method is not particularly limited. For example, silicon nitride, silicon oxide, or aluminum oxide may be used. Further, silicon nitride may be formed by the CVD method on the film formed by the ALD method. The film formed by the ALD method may have a film thickness smaller than that of the film formed by the CVD method. Specifically, the thickness of the film formed by the LAD method may be less than or equal to 50%, and less than or equal to 10%.

[Color Filter]

A color filter may be provided on the protective layer. For example, the color filter with consideration to the size of the organic light-emitting element may be provided on another substrate, and the substrate with the color filter may be bonded to the substrate provided with the light-emitting element. Alternatively, the color filter may be patterned on the above-described protective layer by the photolithography technique. The color filter may be made of a polymeric material.

[Planarization Layer]

A planarization layer may be provided between the color filter and the protective layer. The planarization layer is provided to reduce an unevenness in the lower layer. The objective of forming the planarization layer is not limited, and thus the planarization layer is also called a material resin layer. The planarization layer may be desirably made of an organic compound and may be made of a low-molecular material or a high-molecular material. However, the planarization layer may preferably be made of a high-molecular material.

The planarization layer may be provided above and below the color filter, and the same or different materials may be used for the planarization layers provided above and below the color filter. Specific examples of the materials include polyvinyl carbazole resin, polycarbonate resin, polyester resin, ABS resin, acrylic resin, polyimide resin, phenol resin, epoxy resin, silicone resin, and urea resin.

[Microlens]

The organic light-emitting device may include an optical member, such as a microlens, on the light-emission side. The microlens can be made of acrylic resin, epoxy resin, or the like. The microlens may be disposed to increase the amount of light to be extracted from the organic light-emitting device and to control the direction of light to be extracted. The microlens may have a hemispherical shape. When the microlens has a hemispherical shape, tangential lines that are in contact with the hemispherical shape include a tangential line that is parallel to the insulation layer, and a contact between the tangential line and the hemispherical shape corresponds to the vertex of the microlens. The vertex of the microlens can also be determined in an arbitrary section. Specifically, tangential lines that are in contact with the semicircle of the microlens in a sectional view include a tangential line that is parallel to the insulation layer, and a contact between the tangential line and the semicircle corresponds to the vertex of the microlens.

A midpoint of the microlens can also be defined. In a section of the microlens, when a segment from a point where the shape of an arc ends to a point where the shape of another arc ends is set, the midpoint of the segment can be called the midpoint of the microlens. The section based on which the vertex and the midpoint are determined may be a section vertical to the insulation layer.

[Counter Substrate]

A counter substrate may be provided on the planarization layer. The counter substrate is a substrate that is disposed at a position corresponding to the above-described substrate. The constituent material of the counter substrate may be the same as that of the above-described substrate. When the above-described substrate is referred to as a first substrate, the counter substrate may be referred to as a second substrate.

[Organic Layer]

An organic compound layer (hole injection layer, hole transport layer, electron blocking layer, light-emitting layer, hole blocking layer, electron transport layer, electron injection layer, and the like) forming the organic light-emitting element according to an exemplary embodiment of the present disclosure is formed by a method to be described below.

The organic compound layer forming the organic light-emitting element according to an exemplary embodiment of the present disclosure can be formed by a dry process, such as a vacuum deposition method, an ionization deposition method, a sputtering method, or a plasma method. Instead of using the dry process, a wet process for forming a layer by dissolving a solute in an appropriate solvent and using a well-known coating method (e.g., a spin coating method, a dipping method, a casting method, a Lattice Boltzmann (LB) method, or an inkjet method) can be used.

When the organic compound layer is formed by a vacuum deposition method, a solution coating method, or the like, crystallization or the like hardly occurs and excellent temporal stability is obtained. Further, when the organic compound layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to these examples.

One of these binder resins may be used singly as a homopolymer or a copolymer, or two or more of them may be used in combination. Further, additives, such as a well-known plasticizer, antioxidant, and an ultraviolet absorber may also be used as needed.

[Pixel Circuit]

The light-emitting device may include a pixel circuit connected to the corresponding light-emitting element. The pixel circuit may be an active matrix circuit that controls the light emission from a first light-emitting element and a second light-emitting element independently. The active matrix circuit may be voltage programming or current programming A drive circuit includes a pixel circuit for each pixel. The pixel circuit may include a light-emitting element, a transistor that controls the light-emitting luminance of the light-emitting element, a transistor that controls a light-emission timing, a capacitor that holds a gate voltage of the transistor that controls the light-emitting luminance, and a transistor to be connected to a ground (GND) without passing through the light-emitting element.

The light-emitting device includes a display region and a peripheral region around the display region. The display region includes the pixel circuit, and the peripheral region includes a display control circuit. The mobility of each transistor constituting the pixel circuit may be smaller than the mobility of each transistor constituting the display control circuit.

A slope of current-voltage characteristics of each transistor forming the pixel circuit may be smaller than a slope of current-voltage characteristics of each transistor forming the display control circuit. The slope of current-voltage characteristics can be measured based on so-called Vg-Ig characteristics.

Each transistor forming the pixel circuit is a transistor connected to the corresponding light-emitting element, such as the first light-emitting element.

[Pixel]

The organic light-emitting device includes a plurality of pixels. The pixels include sub-pixels that emit light of different colors, respectively. The sub-pixels may emit light of, for example, R, G, and B light-emitting colors, respectively.

Each pixel includes a region that is also called a pixel opening and emits light. This region is identical to a first region.

The size of the pixel opening may be less than or equal to 15 µm, and more than or equal to 5 µm. More specifically, the size of the pixel opening may be 11 µm, 9.5 µm, 7.4 µm, 6.4 µm, or the like.

The distance between sub-pixels may be less than or equal to 10 µm. Specifically, the distance between sub-pixels may be 8 µm, 7.4 µm, or 6.4 µm.

The pixels may be arranged with a known arrangement configuration in a plan view. For example, a stripe arrangement, a delta arrangement, a pentyl arrangement, or a Bayer arrangement can be used. In a plan view, each sub-pixel may have any known shape. Examples of the shape of each sub-pixel may include a quadrangular shape, such as a rectangular shape or a diamond shape, and a hexagonal shape. Not only a precise rectangular shape, but also a shape similar to a rectangular shape can be included in the rectangular shape. The shape of each sub-pixel and the pixel arrangement may be used in combination.

[Applications of Organic Light-Emitting Element According to Exemplary Embodiment of the Present Invention]

The organic light-emitting element according to an exemplary embodiment of the present disclosure can be used as a constituent member of a display apparatus or a lighting apparatus. Additionally, the organic light-emitting element according to an exemplary embodiment of the present disclosure can also be used as an exposure light source of an electrophotographic image forming apparatus, a backlight of a liquid crystal display apparatus, and a light-emitting device including a color filter in a white color source.

The display apparatus may be an image information processing apparatus including an image input unit that receives image information from an area charge-coupled device (CCD), a linear CCD, a memory card, or the like and an information processing unit that processes the received information, and displays the input image on a display unit.

The display unit included in an image capturing apparatus or an inkjet printer may include a touch panel function. A method of driving the touch panel function may be an infrared method, a capacitive method, a resistive method, or an electromagnetic induction method, and the driving method is not particularly limited. In addition, the display apparatus may also be used as the display unit of a multi-function printer.

Figure 14:
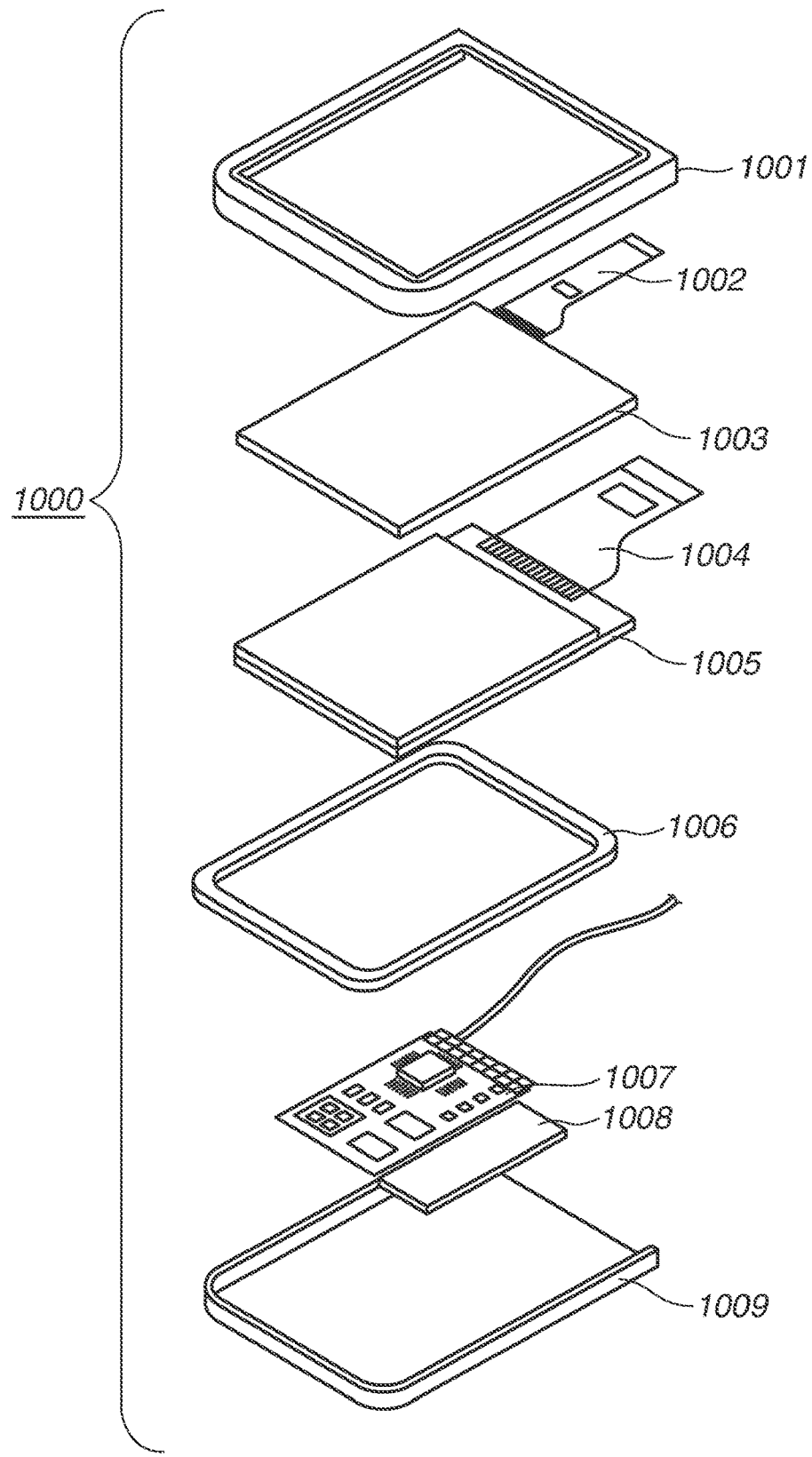
FIG. 14 is a schematic view illustrating an example of a display apparatus according to an exemplary embodiment of the present disclosure.

FIG. 14 is a schematic view illustrating an example of the display apparatus according to the present exemplary embodiment. A display apparatus 1000 may include a touch panel 1003, a display panel 1005, a frame 1006, a circuit board 1007, and a battery 1008 between an upper portion cover 1001 and a lower cover 1009. The touch panel 1003 and the display panel 1005 are connected to one or more flexible printed circuits (FPCs) 1002 and 1004. A transistor is printed on the circuit board 1007. The battery 1008 may be omitted if the display apparatus is not a mobile device. In a case of a mobile device, the battery 1008 may be disposed at a different position.

The display apparatus according to the present exemplary embodiment may include a red color filter, a green color filter, and a blue color filter. The red color filter, the green color filter, and the blue color filter may be arranged in a delta array.

The display apparatus according to the present exemplary embodiment may be used as the display unit of a mobile terminal. In this case, the display apparatus may include a display function and an operation function. Examples of the mobile terminal include a cellular phone, such as a smartphone, a tablet, and a head-mounted display (HMD).

The display apparatus according to the present exemplary embodiment may be used as a display unit of an image capturing apparatus including an optical portion including a plurality of lenses and an image sensor that receives light that has passed through the optical portion. The image capturing apparatus may include a display unit that displays information acquired by the image sensor. The display unit may be a display unit that is exposed to the outside of the image capturing apparatus, or may be a display unit that is disposed in a finder. The image capturing apparatus may be a digital camera or a digital video camera.

Figure 15A:
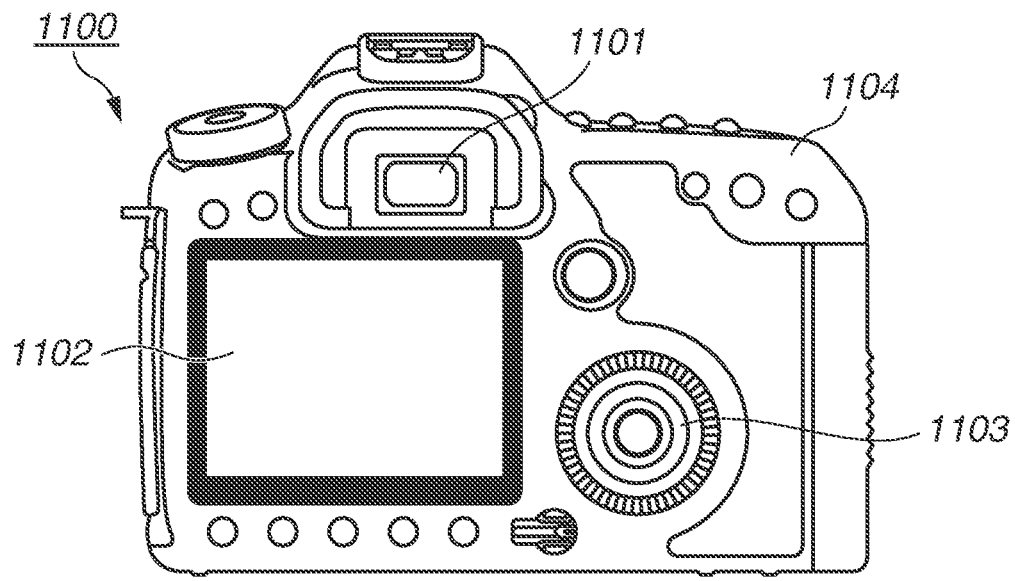
FIG. 15A is a schematic view illustrating an example of an image capturing apparatus according to an exemplary embodiment of the present disclosure.

FIG. 15A is a schematic view illustrating an example of the image capturing apparatus according to the present exemplary embodiment. An image capturing apparatus 1100 includes a viewfinder 1101, a rear display 1102, an operation unit 1103, and a casing 1104. The viewfinder 1101 may include the display apparatus according to the present exemplary embodiment. In this case, the display apparatus may display not only captured images, but also environmental information, an image capturing instruction, and the like. The environmental information may include an external light intensity, an external light orientation, an object movement speed, and the possibility that an object is shielded by a shielding material.

A suitable image capturing timing is only a short period of time, and thus it may be desirable to display information as early as possible. Thus, it may be desirable to use the display apparatus using the organic light-emitting element according to the present exemplary embodiment. This is because the organic light-emitting element has a high response speed. The display apparatus using the organic light-emitting element according to the present exemplary embodiment can be used more suitably for the above-described apparatuses and the liquid crystal display apparatus that are required to have a high display speed.

The image capturing apparatus 1100 includes an optical portion (not illustrated). The optical portion includes a plurality of lenses, and an image is formed on the image sensor accommodated in the casing 1104. A focal point of each of the plurality of lenses can be adjusted by adjusting relative positions of the lenses. This operation can be automatically performed. The image capturing apparatus may also be called a photoelectric conversion apparatus. The photoelectric conversion apparatus may perform, instead of performing a method of sequentially capturing images, an image capturing method, such as a method of detecting a difference from a previous image, or a method of clipping images constantly recorded.

Figure 15B:
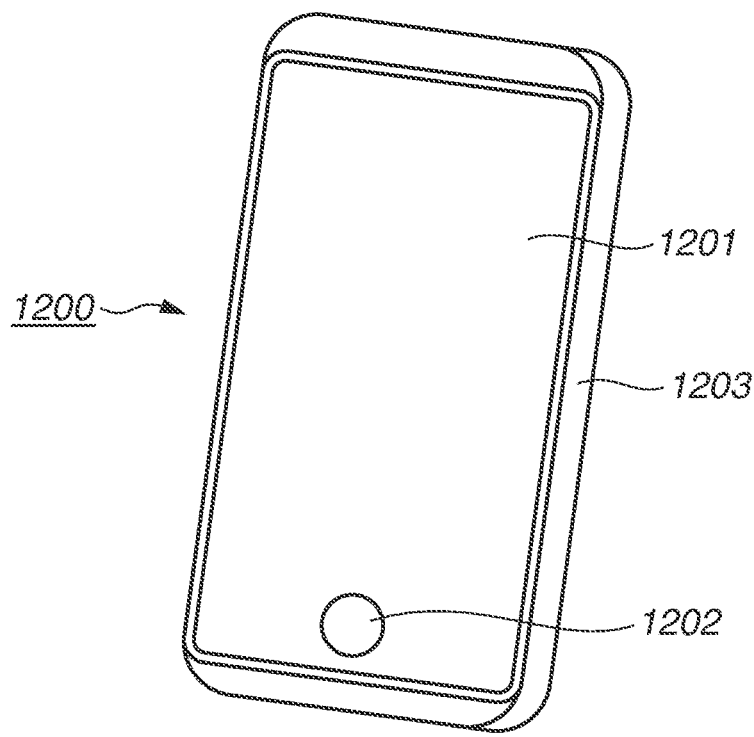
FIG. 15B is a schematic view illustrating an example of an electronic apparatus according to an exemplary embodiment of the present disclosure.

FIG. 15B is a schematic view illustrating an example of an electronic apparatus according to an exemplary embodiment of the present disclosure. An electronic apparatus 1200 includes a display unit 1201, an operation unit 1202, and a casing 1203. The casing 1203 may accommodate a circuit, a printed circuit board including the circuit, a battery, and a communication unit. The operation unit 1202 may be a button or a response portion using a touch panel method. The operation unit may be a biometric recognition portion that recognizes a fingerprint and performs unlocking and the like. The electronic apparatus including the communication unit can also be called a communication apparatus. The electronic apparatus provided with a lens and an image sensor may further include a camera function. Images captured by the camera function are displayed on the display unit. Examples of the electronic apparatus include a smartphone and a laptop computer.

Figure 16A:
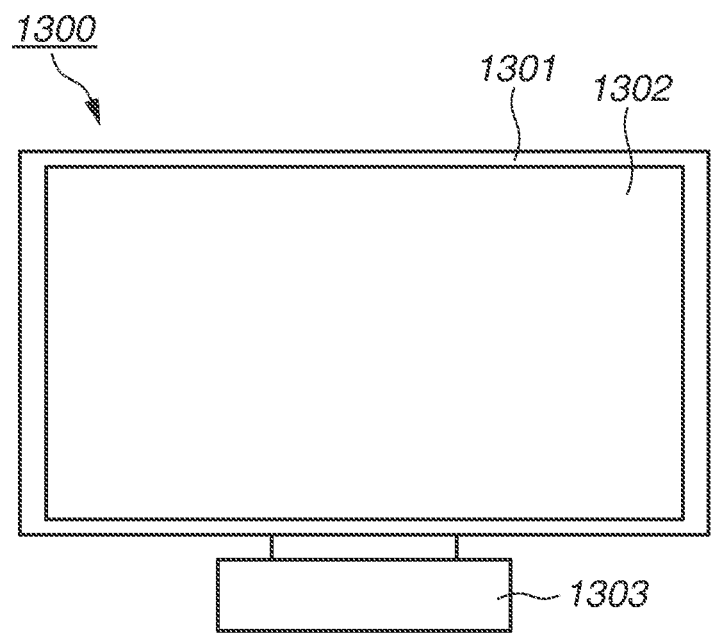
FIG. 16A is a schematic view illustrating an example of the display apparatus according to the exemplary embodiment.
Figure 16B:
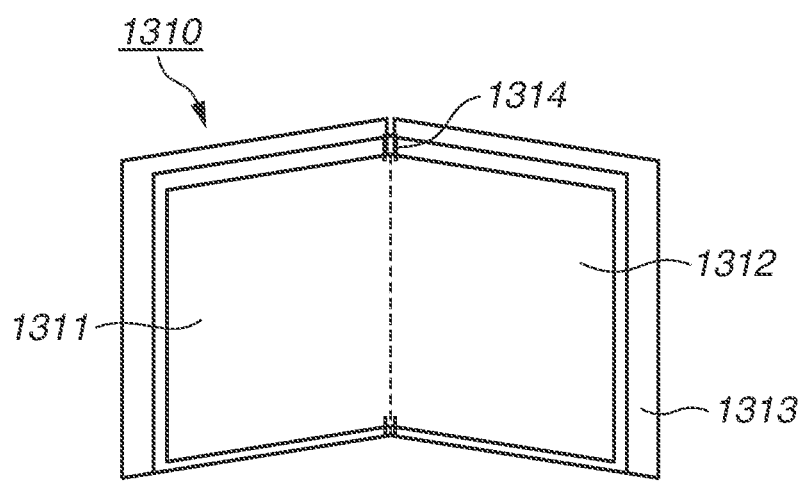
FIG. 16B is a schematic view illustrating an example of a foldable display apparatus.

FIGS. 16A and 16B are schematic views each illustrating an example of the display apparatus according to the present exemplary embodiment. FIG. 16A illustrates a display apparatus, such as a television monitor or a personal computer (PC) monitor. A display apparatus 1300 includes a frame 1301 and a display unit 1302. The light-emitting device according to the present exemplary embodiment may be used as the display unit 1302.

The display apparatus 1300 also includes a base 1303 that supports the frame 1301 and the display unit 1302. The base 1303 is not limited to the configuration illustrated in FIG. 16A. The lower hem of the frame 1301 may also function as a base.

The frame 1301 and the display unit 1302 may be formed to be foldable. The curvature radius of the frame 1301 and the display unit 1302 may be 5000 mm to 6000 mm.

FIG. 16B is a schematic view illustrating another example of the display apparatus according to the present exemplary embodiment. A display apparatus 1310 illustrated in FIG. 16B is a so-called foldable display apparatus that is formed to be foldable. The display apparatus 1310 includes a first display unit 1311, a second display unit 1312, a casing 1313, and a folding point 1314. The first display unit 1311 and the second display unit 1312 may include the light-emitting device according to the present exemplary embodiment. The first display unit 1311 and the second display unit 1312 may form a single display apparatus with no boundary. The first display unit 1311 and the second display unit 1312 can be folded at the folding point 1314. The first display unit 1311 and the second display unit 1312 may display different images, respectively. Alternatively, a single image may be displayed on the combined area of the first display unit 1311 and the second display unit 1312.

Applications of the display apparatus according to the exemplary embodiments will be described with reference to FIGS. 17A and 17B. The display apparatus can be applied to a wearable system as a wearable device, such as smart glasses, a HMD, or a smart contact. The image capturing display apparatus for these applications includes the image capturing apparatus configured to photoelectrically convert visible light, and the display apparatus configured to emit visible light.

Figure 17A:
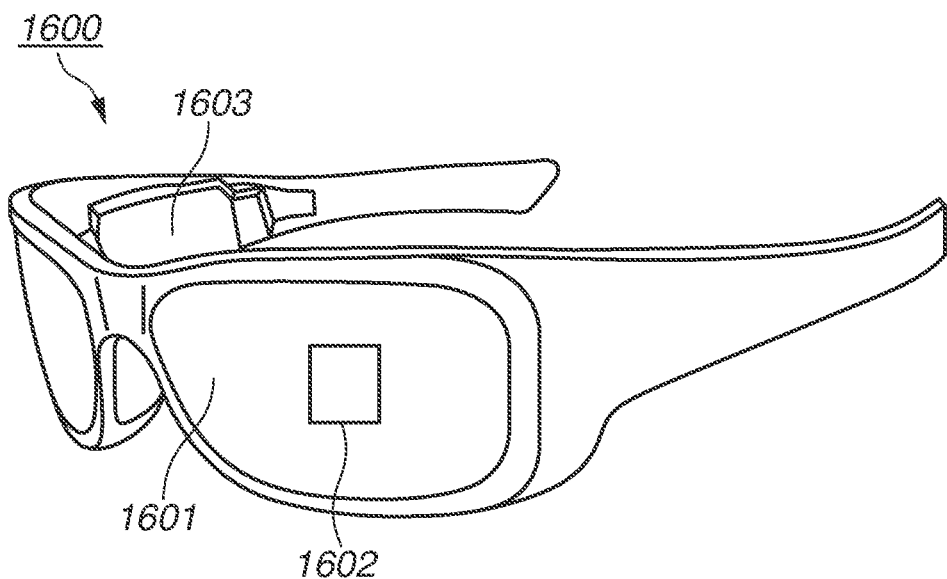
FIG. 17A is a schematic view illustrating an example of a wearable device according to an exemplary embodiment of the present disclosure.

FIG. 17A illustrates glasses 1600 (smart glasses) according to an application example. An image capturing apparatus 1602, such as a complementary metal-oxide semiconductor (CMOS) sensor or a single-photon avalanche diode (SPAD) sensor, is provided on the front surface of each lens 1601 of the glasses 1600. The display apparatus according to the exemplary embodiments described above is provided on the back surface of each lens 1601.

The glasses 1600 further include a control apparatus 1603. The control apparatus 1603 functions as a power supply that supplies power to the image capturing apparatus 1602 and the display apparatus according to the exemplary embodiments. The control apparatus 1603 controls operation of each of the image capturing apparatus 1602 and the display apparatus. An optical system that collects light on the image capturing apparatus 1602 is formed on each lens 1601.

Figure 17B:
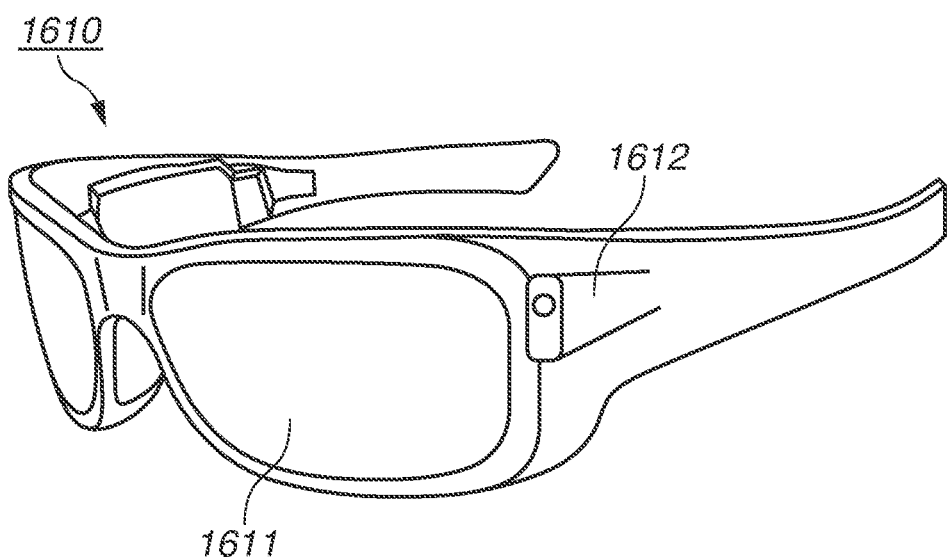
FIG. 17B is a schematic view illustrating an example of the wearable device according to the exemplary embodiment as a configuration including the image capturing apparatus.

FIG. 17B illustrates glasses 1610 (smart glasses) according to another application example. The glasses 1610 include a control apparatus 1612. An image capturing apparatus corresponding to the image capturing apparatus 1602 and a display apparatus are mounted on the control apparatus 1612. Each lens 1611 is provided with the image capturing apparatus in the control apparatus 1612 and an optical system for projecting light emitted from the display apparatus, and an image is projected on each lens 1611. The control apparatus 1612 functions as a power supply for supplying power to each of the image capturing apparatus and the display apparatus, and controls operation of each of the image capturing apparatus and the display apparatus. The control apparatus may include a line-of-sight detection unit that detects the line of sight of a wearer. An infrared ray may be used to detect the line of sight. An infrared light-emitting unit emits infrared light to the eyeball of a user who is gazing at a display image. Reflected light of the emitted infrared light from the eyeball is detected by an image capturing unit including the light-receiving element, to obtain a captured image of the eyeball. A reduction unit that reduces the amount of light transmitted from the infrared light-emitting unit to the display unit in a plan view is disposed to reduce deterioration in image quality.

The line of sight of the user on the display image is detected from the captured image of the eyeball obtained by capturing infrared light. A known method can be applied for line-of-sight detection using the captured image of the eyeball. For example, a line-of-sight detection method based on Purkinje image obtained by reflection of irradiated light from a cornea can be used.

More specifically, line-of-sight detection processing is performed based on a pupil and corneal reflection method. The line of sight of the user is detected by calculating a line-of-sight vector representing the orientation (rotational angle) of an eyeball by the pupil and corneal reflection method based on a pupil image included in the captured image of the eyeball and Purkinje image.

The display apparatus according to an exemplary embodiment of the present disclosure may include the image capturing apparatus including the light-receiving element, and may control a display image on the display apparatus based on line-of-sight information about the user from the image capturing apparatus.

Specifically, in the display apparatus, a first line-of-sight region gazed at by the user and a second line-of-sight region other than the first line-of-sight region are determined based on line-of-sight information. The first line-of-sight region and the second line-of-sight region may be determined by the control apparatus of the display apparatus, or the first line-of-sight region and the second line-of-sight region that are determined by an external control apparatus may be received from the external control apparatus. In the display region of the display apparatus, the display resolution of the first line-of-sight region may be controlled to be higher than the display resolution of the second line-of-sight region. In other words, the resolution of the second line-of-sight region may be lower than the resolution of the first line-of-sight region.

The display region includes a first display region and a second display region different from the first display region. Based on the line-of-sight information, a region with higher priority is determined from the first display region and the second display region. The first line-of-sight region and the second line-of-sight region may be determined by the control apparatus of the display apparatus, or the first line-of-sight region and the second line-of-sight region that are determined by an external control apparatus may be received from the external control apparatus. The resolution of a region with a higher priority may be controlled to be higher than the resolution of a region other than the region with a higher priority. In other words, the resolution of a region with a relatively low priority may be decreased.

An artificial intelligence (AI) may be used to determine the first line-of-sight region or a region with a higher priority. The AI may be a model configured to estimate the angle of the line of sight from the eyeball image and the distance to an object indicated by the user's gaze by using the eyeball image and the actual orientation of line of sight from the eyeball as teacher data. An AI program is included in any one of the display apparatus, the image capturing apparatus, and an external apparatus. When the external apparatus includes an AI program, the AI program is transmitted to the display apparatus via communication.

When display control is performed based on visual detection, the display control can be appropriately applied to smart glasses further including the image capturing apparatus that captures external information. The smart glasses can display captured external information in real time.

As described above, the use of an apparatus using the organic light-emitting element according to the present exemplary embodiment enables stable display of images with an excellent image equality in a long-term display.

According to an aspect of the present disclosure, it is possible to provide an organic device with a reduced leakage current between pixels.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-112965, filed Jul. 7, 2021, which is hereby incorporated by reference herein in its entirety.

What is claimed is:

1. An organic device comprising:
a first element; and
a second element disposed adjacent to the first element in a first direction,
wherein the first element and the second element include a first electrode, a second electrode, an organic layer disposed between the first electrode and the second electrode, and an insulation layer covering an upper surface and a side surface of the first electrode at an end of the first electrode,
wherein the first electrode, the organic layer, and the second electrode are disposed in this order in a second direction vertical to the first direction,
wherein the insulation layer has, between the first element and the second element, an eaves shape including a protruding portion protruding from the insulation layer of the first element toward the second element, and
wherein the organic layer includes a charge transport layer and a functional layer and satisfies the following Inequality (1):

$$\begin{cases} 2t > x2 > 2t' \\ t > x1 > t' \\ y > t' \end{cases} \quad (1)$$

where t represents a total film thickness in the first direction of the organic layer including the charge transport layer and the functional layer in the eaves shape, t' represents a film thickness in the first direction of the charge transport layer in the eaves shape, x1 represents a protruding amount of the eaves shape in the first direction, x2 represents a distance between the eaves shape of the first element and the eaves shape of the second element, and y represents a distance in the second direction from a lower surface of the first electrode to the protruding portion of the eaves shape.

2. The organic device according to claim 1, wherein the Inequality (1) is satisfied in a case where, in a section, the total film thickness t represents a minimum film thickness and the film thickness t' in the first direction represents a maximum film thickness.

3. The organic device according to claim 1, wherein the organic layer includes a discontinuous portion at least in the eaves shape, and the second electrode is continuous.

4. An organic device comprising:
a first element; and
a second element disposed adjacent to the first element in a first direction,
wherein the first element and the second element include a first electrode, a second electrode, an organic layer disposed between the first electrode and the second electrode, and an insulation layer covering an upper surface and a side surface of the first electrode at an end of the first electrode, wherein the first electrode, the organic layer, and the second electrode are disposed in this order in a second direction vertical to the first direction, wherein the insulation layer has, between the first element and the second element, an eaves shape including a protruding portion protruding from the insulation layer of the first element toward the second element, wherein the insulation layer includes the protruding portion only between the first element and the second element, and wherein the protruding portion of the eaves shape and a side surface portion of the eaves shape are made of materials different from each other.

5. The organic device according to claim 4, wherein the side surface portion of the eaves shape, an upper portion of the eaves shape, and a bottom portion of the eaves shape are made of insulating materials different from each other.

6. The organic device according to claim 4, wherein an upper portion of the eaves shape is made of an organic material, and the side surface portion of the eaves shape is made of an inorganic material.

7. The organic device according to claim 4, wherein the side surface portion of the eaves shape is made of an organic insulating material.

8. The organic device according to claim 4, wherein the organic layer includes a charge transport layer and a functional layer and satisfies the following Inequality (1):

$$\begin{cases} 2t > x2 > 2t' \\ t > x1 > t' \\ y > t' \end{cases} \quad (1)$$

where t represents a total film thickness in the first direction of the organic layer including the charge transport layer and the functional layer in the eaves shape, t' represents a film thickness in the first direction of the charge transport layer in the eaves shape, x1 represents a protruding amount of the eaves shape in the first direction, x2 represents a distance between the eaves shape of the first element and the eaves shape of the second element, and y represents a distance in the second direction from a lower surface of the first electrode to the protruding portion of the eaves shape.

9. The organic device according to claim 8, wherein the Inequality (1) is satisfied in a case where, in a section, the total film thickness t represents a minimum film thickness and the film thickness t' in the first direction represents a maximum film thickness.

10. The organic device according to claim 8, wherein the organic layer includes a discontinuous portion at least in the eaves shape, and the second electrode is continuous.

11. The organic device according to claim 8, wherein the functional layer is a light-emitting layer.

12. A display apparatus comprising:
the organic device according to claim 1; and
a transistor connected to the organic device,
wherein the functional layer is a light-emitting layer.

13. An image capturing apparatus comprising:
an optical unit including a plurality of lenses;
an image sensor configured to receive light transmitted through the optical unit; and
a display unit configured to display an image captured by the image sensor,
wherein the display unit includes the organic device according to claim 1 and the functional layer is a light-emitting layer.

14. An electronic apparatus comprising:
a display unit including the organic device according to claim 1;
a casing provided with the display unit; and
a communication unit provided in the casing and configured to communicate with an external apparatus,
wherein the functional layer is a light-emitting layer.

* * * * *